United States Patent
Campanella-Pineda et al.

(10) Patent No.: US 10,468,454 B1
(45) Date of Patent: Nov. 5, 2019

(54) GAN STACK ACOUSTIC REFLECTOR AND METHOD FOR PRODUCING THE SAME

(71) Applicant: GLOBALFOUNDRIES Singapore Pte. Ltd., Singapore (SG)

(72) Inventors: Humberto Campanella-Pineda, Singapore (SG); Anthony Stamper, Burlington, VT (US); Vibhor Jain, Essex Junction, VT (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/962,821

(22) Filed: Apr. 25, 2018

(51) Int. Cl.
| | | |
|---|---|---|
| *H01L 29/15* | (2006.01) | |
| *H01L 31/0256* | (2006.01) | |
| *H01L 27/20* | (2006.01) | |
| *H01L 29/205* | (2006.01) | |
| *H01L 23/31* | (2006.01) | |

(Continued)

(52) U.S. Cl.
CPC .......... *H01L 27/20* (2013.01); *H01L 21/0254* (2013.01); *H01L 21/56* (2013.01); *H01L 21/76898* (2013.01); *H01L 21/84* (2013.01); *H01L 23/291* (2013.01); *H01L 23/3171* (2013.01); *H01L 29/2003* (2013.01); *H01L 29/205* (2013.01); *H01L 29/66462* (2013.01); *H01L 29/7787* (2013.01); *H03H 3/02* (2013.01); *H03H 9/1042* (2013.01); *H03H 9/132* (2013.01); *H03H 9/175* (2013.01); *H03H 9/545* (2013.01); *H03H 9/564* (2013.01); *H01L 21/0217* (2013.01); *H01L 21/02164* (2013.01); *H01L 41/0477* (2013.01); *H01L 41/187* (2013.01); *H01L 41/1873* (2013.01); *H01L 41/1876* (2013.01); *H01L 41/193* (2013.01); *H01L 41/29* (2013.01); *H03F 3/213* (2013.01);

(Continued)

(58) Field of Classification Search
USPC .......................... 257/76, 192, 194, 285, 197, 257/E29.246–E29.253; 438/167, 172
See application file for complete search history.

(56) References Cited

U.S. PATENT DOCUMENTS

| | | |
|---|---|---|
| 6,583,690 B2 | 6/2003 | Lee et al. |
| 8,212,294 B2 | 7/2012 | Hoke et al. |

(Continued)

OTHER PUBLICATIONS

Kazior, "Beyond CMOS: Heterogeneous Integration of III-V Devices, RF MEMS and other Dissimilar Materials/Devices with Si CMOS to Create Intelligent Microsystems", Philosophical transactions of the Royal society A, vol. 372, 2014, 15 Pages.

(Continued)

*Primary Examiner* — Niki H Nguyen
(74) *Attorney, Agent, or Firm* — Ditthavong & Steiner P.C.

(57) ABSTRACT

Methods of forming a thin-film piezoelectric acoustic filter, a GaN-channel/buffer Bragg reflector, and a monolithically integrated GaN HEMT PA and CMOS over a [111] crystal orientation Si handle of a SOI wafer and resulting devices are provided. Embodiments include providing a SOI wafer including a [111] crystal orientation Si handle, a BOX layer, and a top Si layer; forming a CMOS device over the top Si layer; and forming a Bragg reflector over the [111] crystal orientation Si handle wafer, the Bragg reflector including a GaN stack with alternating layers of high/low acoustic impedance.

18 Claims, 21 Drawing Sheets

(51) Int. Cl.

| | | |
|---|---|---|
| *H01L 29/778* | (2006.01) | |
| *H01L 29/66* | (2006.01) | |
| *H03H 3/02* | (2006.01) | |
| *H03H 9/10* | (2006.01) | |
| *H03H 9/13* | (2006.01) | |
| *H03H 9/17* | (2006.01) | |
| *H03H 9/56* | (2006.01) | |
| *H03H 9/54* | (2006.01) | |
| *H01L 21/84* | (2006.01) | |
| *H01L 21/02* | (2006.01) | |
| *H01L 21/768* | (2006.01) | |
| *H01L 21/56* | (2006.01) | |
| *H01L 23/29* | (2006.01) | |
| *H01L 29/20* | (2006.01) | |
| *H01L 41/047* | (2006.01) | |
| *H01L 41/187* | (2006.01) | |
| *H01L 41/193* | (2006.01) | |
| *H03F 3/213* | (2006.01) | |
| *H01L 41/29* | (2013.01) | |

(52) U.S. Cl.
CPC .. *H03F 2200/165* (2013.01); *H03F 2200/171* (2013.01); *H03H 2003/025* (2013.01)

(56) References Cited

U.S. PATENT DOCUMENTS

| | | | |
|---|---|---|---|
| 8,304,271 B2 | 11/2012 | Huang et al. | |
| 8,665,013 B2 | 3/2014 | Saunders | |
| 8,823,146 B1 | 9/2014 | Hoke | |
| 8,866,190 B2 | 10/2014 | Briere | |
| 9,356,045 B2 | 5/2016 | Comeau et al. | |
| 2009/0261346 A1* | 10/2009 | Chen | H01L 21/76283 257/76 |
| 2012/0061681 A1* | 3/2012 | Thei | H01L 21/8258 257/77 |
| 2013/0234145 A1* | 9/2013 | Hirler | H01L 21/8258 257/76 |
| 2014/0361371 A1* | 12/2014 | Comeau | H01L 27/1203 257/351 |
| 2015/0318276 A1* | 11/2015 | Bayram | H01L 21/8258 257/195 |
| 2017/0309676 A1* | 10/2017 | Odnoblyudov | H01L 33/0075 |
| 2018/0166339 A1* | 6/2018 | Hsueh | H01L 27/085 |
| 2019/0006171 A1* | 1/2019 | Dasgupta | H01L 23/481 |

OTHER PUBLICATIONS

Popa et al., "L-Band Lamb Mode Resonators in Gallium Nitride MMIC Technology", IEEE International Frequency Control Symposium, 2014, retrieved on Sep. 5, 2017 from https://pdfs.semanticscholar.org/5cb2/b07681c43488c3e9b6e21a34eb006c68fb4e.pdf?_ga=2.114976007.122177536.1504587491-439456525.1504587491, 4 Pages.

Chung et al., "GaN-on-Si Technology, A New Approach for Advanced Devices in Energy and Communications", Proceedings of the European Solid-State Device Research Conference (ESSDERC), 2010, 5 Pages.

* cited by examiner

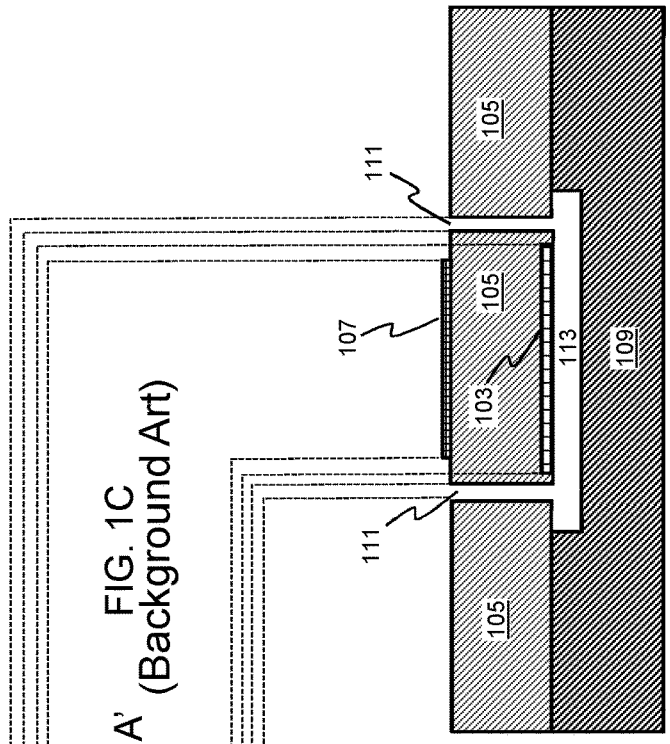
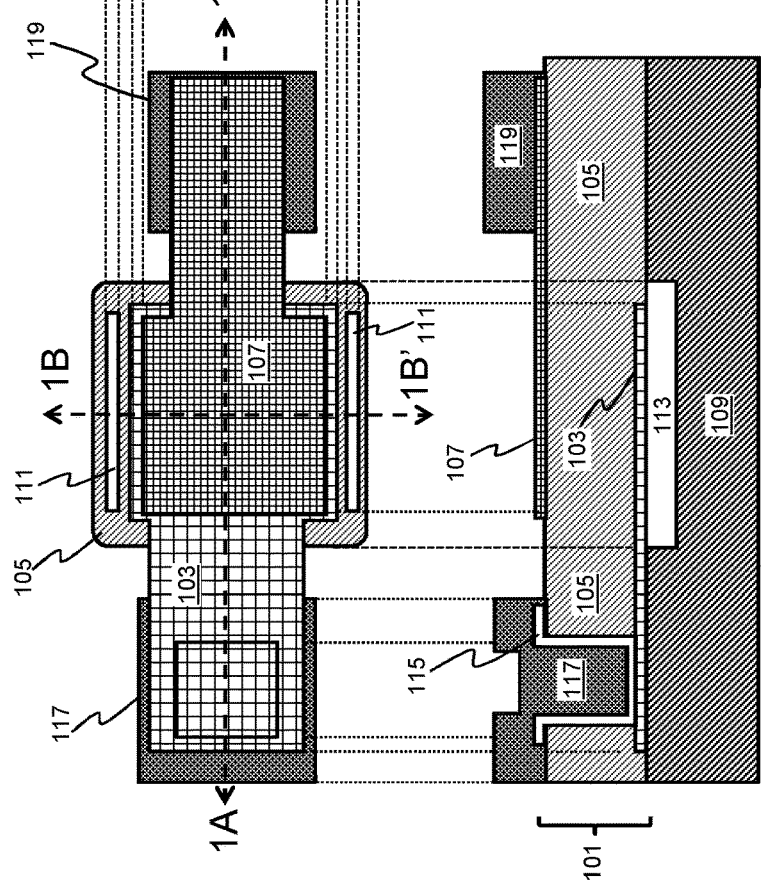
FIG. 1A
(Background Art)
FIG. 1B
(Background Art)
FIG. 1C
(Background Art)

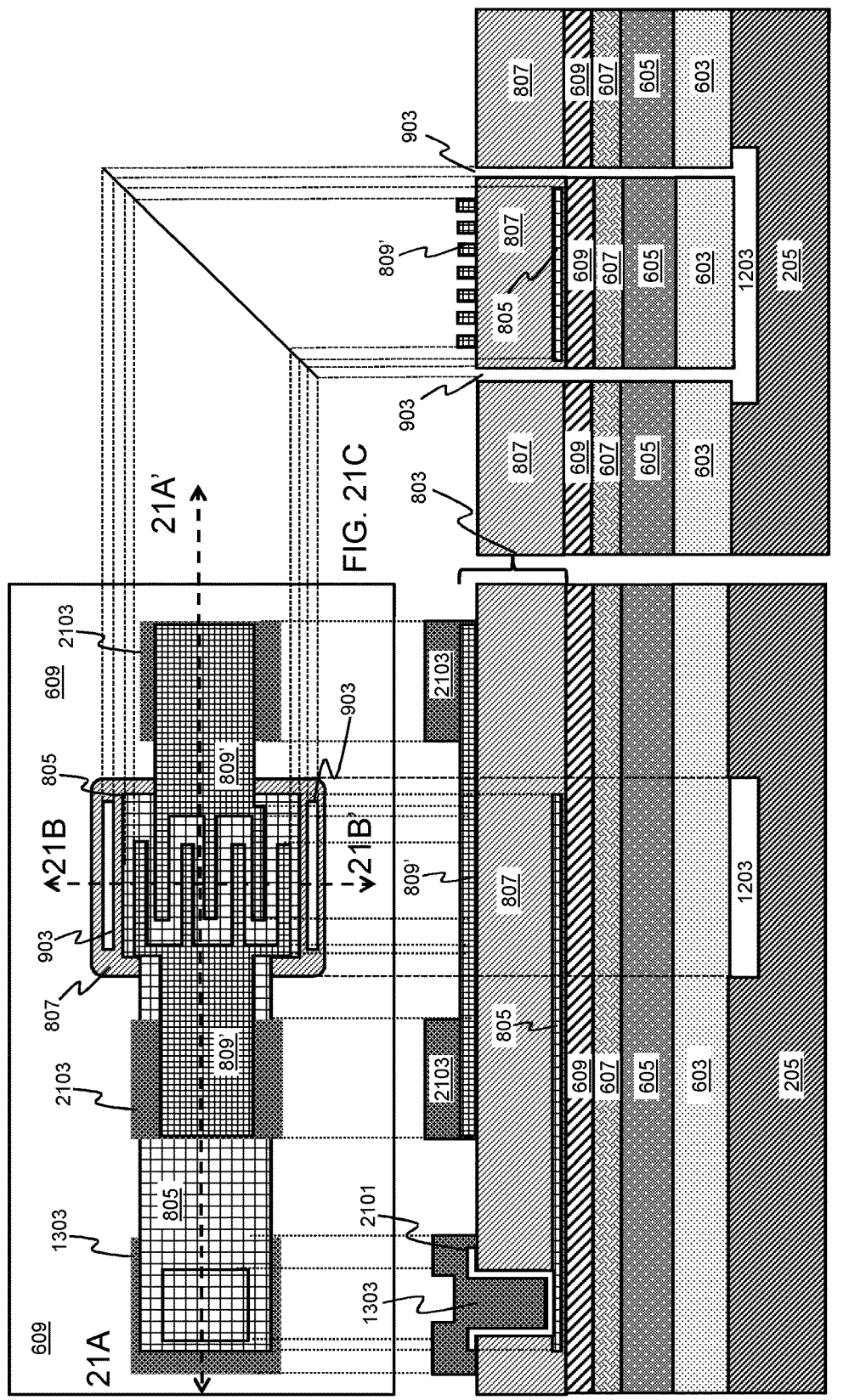

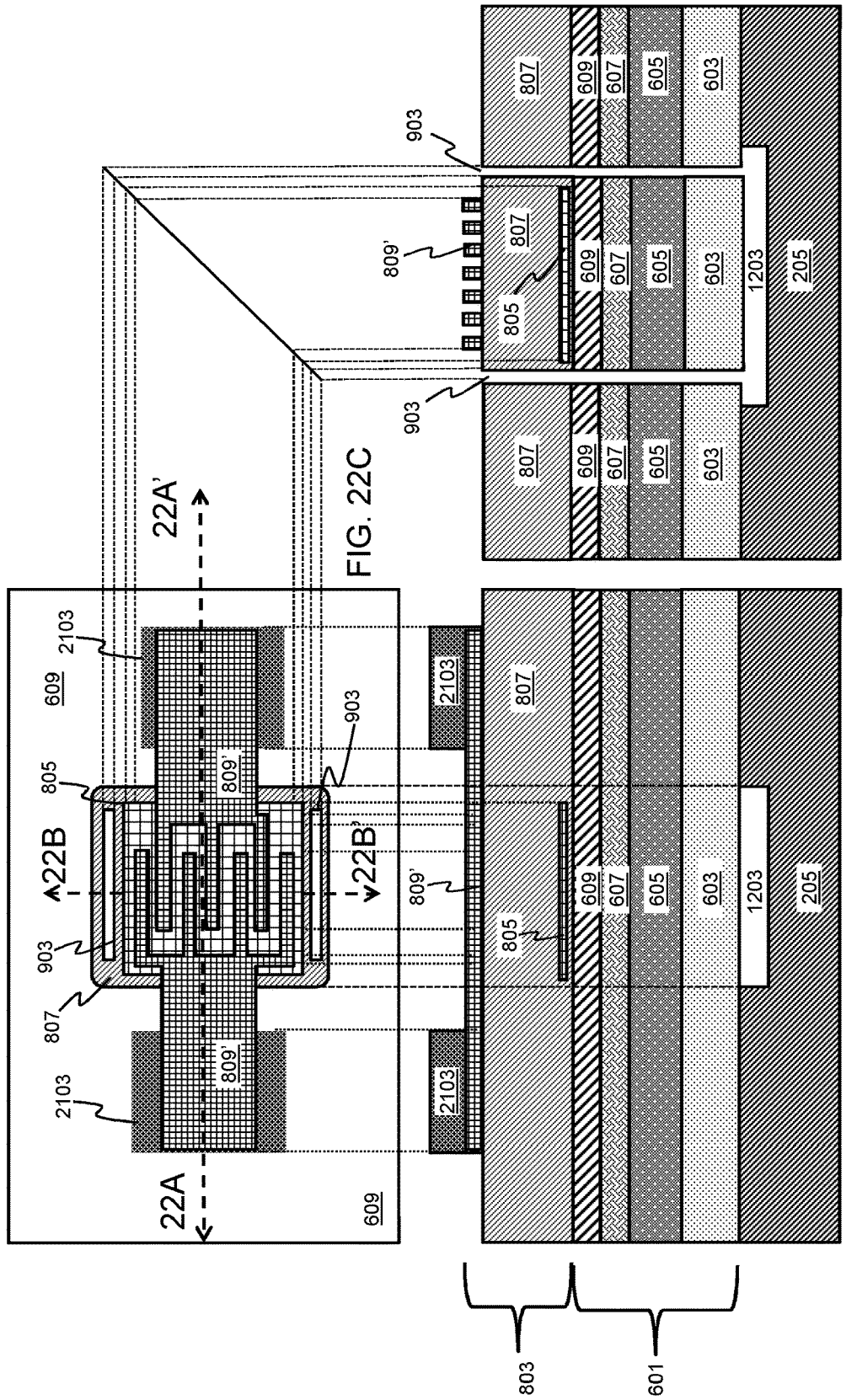

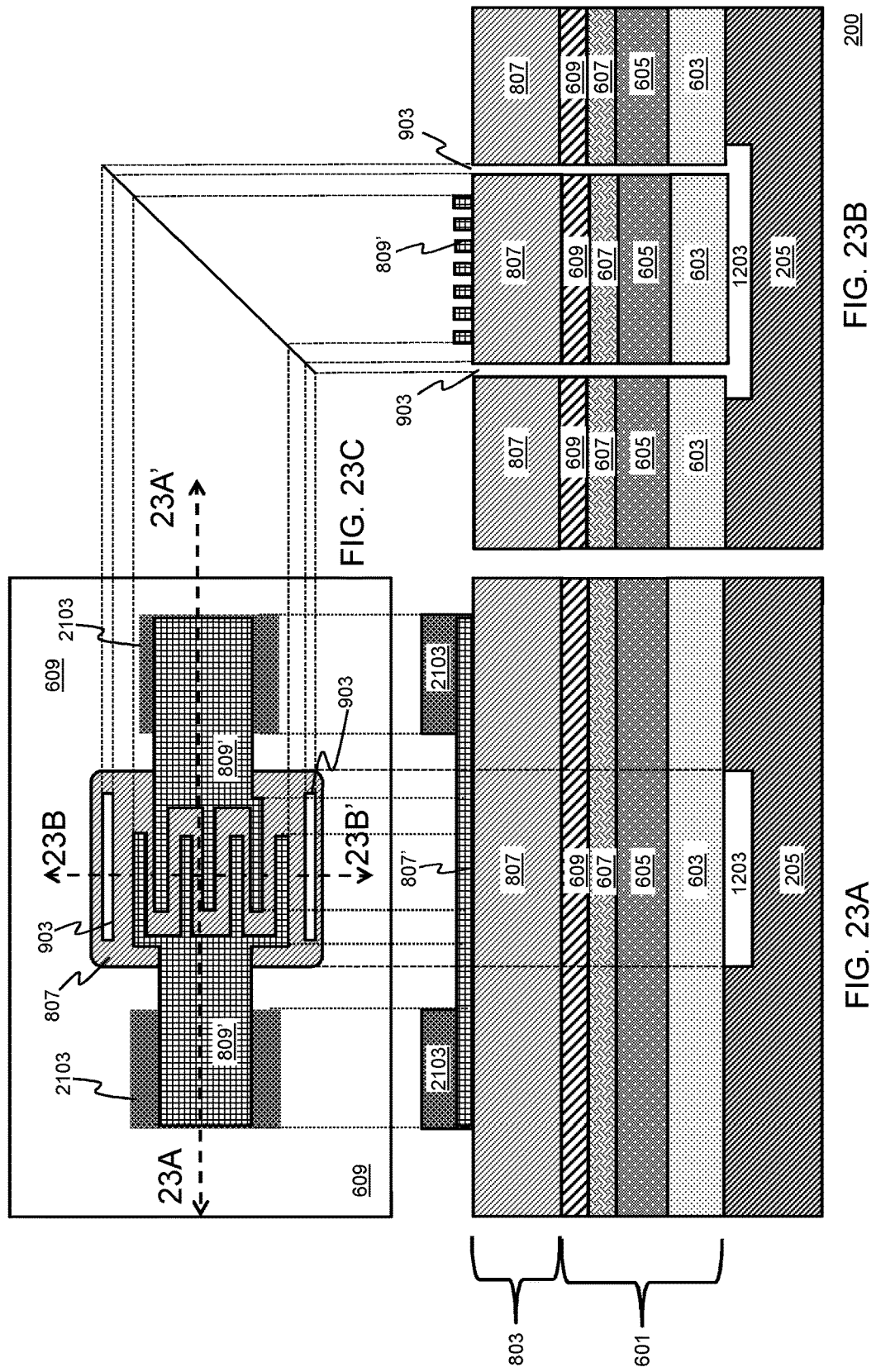

US 10,468,454 B1

GAN STACK ACOUSTIC REFLECTOR AND METHOD FOR PRODUCING THE SAME

TECHNICAL FIELD

The present disclosure relates to a manufacture of semiconductor devices such as integrated circuits. The present disclosure is particularly applicable to forming a gallium nitride (GaN)-based Bragg reflector of a thin-film piezoelectric acoustic filter.

BACKGROUND

Wireless communication channels such as wireless fidelity (WiFi), cellular, sub-6 (gigahertz) GHz spectrum for fifth generation wireless systems (5G), etc., need good power amplifier (PA), low-noise amplifier (LNA), switch, CMOS logic, and filters. Known designs use multi-chip solutions including complimentary-metal-oxide semiconductor (CMOS), radio frequency complimentary-metal-oxide semiconductor (RFCMOS), BiCMOS, gallium arsenide (GaAs), GaN, filters, etc. However, known acoustic filters using layers of GaN show poor quality (Q) and electromechanical coupling coefficient ($k^2_{eff}$).

A known bulk acoustic wave (BAW) filter on a silicon (Si) substrate is depicted in FIGS. 1A, 1B, and 1C. FIGS. 1A and 1B schematically illustrate cross-sectional views along the cut lines 1A-1A' and 1B-1B' of FIG. 1C, and FIG. 1C is a top view. Referring to FIGS. 1A, 1B, and 1C, a BAW filter 101 including a bottom electrode 103, an aluminum nitride (AlN) acoustic layer 105, and a top electrode 107 is formed over a Si substrate 109. The known structure also includes vias 111 through the AlN layer 105 and a cavity 113 in a portion of the Si substrate 103 under respective portions of the bottom electrode 103 and the AlN layer 105. Further, the known structure includes a liner 115 and a metal contact 117 through the AlN layer 105 down to the bottom electrode 103 and a second metal contact 119 on a portion of the top electrode 107. This BAW filter 101; however, does not include a GaN channel or a GaN PA.

A need therefore exists for methodology enabling formation of an integrated acoustic filter, GaN PA, and CMOS with high Q and coupling $k^2_{eff}$ and the resulting device.

SUMMARY

An aspect of the present disclosure is a method of forming a thin-film acoustic filter, a GaN-channel/buffer Bragg reflector, and a monolithically integrated GaN high-electron-mobility transistor power amplifier (GaN HEMT PA) and CMOS over a [111] crystal orientation Si handle wafer of a silicon on insulator (SOI) wafer.

Another aspect of the present disclosure is a device including a thin-film acoustic filter, a GaN-channel/buffer Bragg reflector, and a monolithically integrated GaN HEMT PA and CMOS over a [111] crystal orientation Si handle wafer of a SOI wafer.

A further aspect of the present disclosure is a device including a thin-film acoustic filter and a monolithically integrated GaN HEMT PA and CMOS over a [111] crystal orientation Si handle wafer of a SOI wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a SOI wafer including a [111] crystal orientation Si handle wafer, a buried oxide (BOX) layer, and a top Si layer; forming a CMOS device over the top Si layer; and forming a Bragg reflector over the crystal orientation Si handle wafer, the Bragg reflector including a GaN stack with alternating layers of high/low acoustic impedance.

Another aspect of the present disclosure is a device including: a SOI wafer, the SOI wafer including a [111] crystal orientation Si handle wafer, a BOX layer, and a top Si layer; a CMOS device over the top Si layer; and a Bragg reflector over the [111] crystal orientation Si handle wafer, the Bragg reflector including a GaN stack with alternating layers of high/low acoustic impedance.

A further aspect of the present disclosure is a device including: a SOI wafer, the SOI wafer including a [111] crystal orientation Si handle wafer, a BOX layer, and a top Si layer; a CMOS device over the top Si layer; a GaN stack over the [111] crystal orientation Si handle wafer; a GaN HEMT PA in and over the GaN stack; a thin-film Lamb acoustic wave filter over the GaN stack; a via through the first molybdenum (Mo) or tungsten (W) layer on opposite sides of the thin-film Lamb acoustic wave filter; and a cavity under the thin-film Lamb acoustic filter in a passivation layer of the GaN stack.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate simplified cross-sectional views of a background BAW filter;

FIG. 1C schematically illustrates a top view showing the cut lines for FIGS. 1A and 1B;

FIGS. 21A and 21B schematically illustrate simplified cross-sectional views of a thin-film piezoelectric Lamb acoustic wave filter on a GaN stack with a bottom electrode having contact to a reference voltage, in accordance with an exemplary embodiment;

FIG. 21C schematically illustrates a top view showing the cut lines for FIGS. 21A and 21B;

FIGS. 22A and 22B schematically illustrate simplified cross-sectional views of a thin-film piezoelectric Lamb acoustic wave filter on a GaN stack with a floating bottom electrode, in accordance with an exemplary embodiment;

FIG. 22C schematically illustrates a top view showing the cut lines for FIGS. 22A and 22B;

FIGS. 23A and 23B schematically illustrate simplified cross-sectional views of a thin-film piezoelectric Lamb acoustic wave filter on a GaN stack without a bottom electrode, in accordance with an exemplary embodiment; and FIG. 23C schematically illustrates a top view showing the cut lines for FIGS. 23A and 23B.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of multi-chip requirements; poor Q and $k^2_{eff}$; and poor crystal quality and wide full width at half maximum (FWHM) of (002) AlN orientation attendant upon addressing various wireless communication channel needs; forming an acoustic layer of a filter on a buffer epitaxial (epi) GaN or GaN channel; and using an AlN buffer, respectively. The problems are solved, inter alia, by forming a thin-film piezoelectric acoustic filter, e.g., an AlN acoustic filter, a GaN-channel/buffer Bragg reflector and/or air gap, and a monolithically integrated GaN HEMT PA and CMOS over a portion of a [111] crystal orientation Si handle wafer of a SOI wafer.

Methodology in accordance with embodiments of the present disclosure includes providing a SOI wafer including a [111] crystal orientation Si handle wafer, a BOX layer, and a top SI layer. A CMOS device is formed over the top Si layer and a Bragg reflector is formed over the [111] crystal orientation Si handle wafer, the Bragg reflector including a GaN stack is formed with alternating layers of high/low acoustic impedance.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
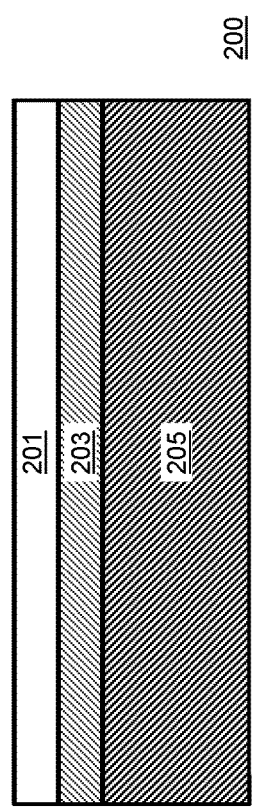
FIGS. 2 through 13 schematically illustrate cross-sectional views of a process flow for forming a thin-film piezoelectric BAW filter, a silicon nitride (SiN)/GaN-channel/buffer Bragg reflector, and a monolithically integrated GaN HEMT PA and CMOS over a portion of a [111] crystal orientation Si handle wafer of a SOI wafer, in accordance with an exemplary embodiment.

FIGS. 2 through 13 schematically illustrate cross-sectional views of a process flow for forming a thin-film piezoelectric BAW resonator filter, a SiN/GaN-channel/buffer Bragg reflector, and a monolithically integrated GaN HEMT PA and CMOS over a portion of a [111] crystal orientation Si handle wafer of a SOI wafer, in accordance with an exemplary embodiment. Referring to FIG. 2, an SOI wafer 200 is provided with a top Si layer 201 (device layer) having a [100], [111], or [110] crystal orientation (rotated 45° for a p-channel field-effect transistor (PFET)), e.g., an [100] crystal orientation, over a BOX layer 203, and a [111] crystal orientation Si handle wafer 205.

Figure 3:
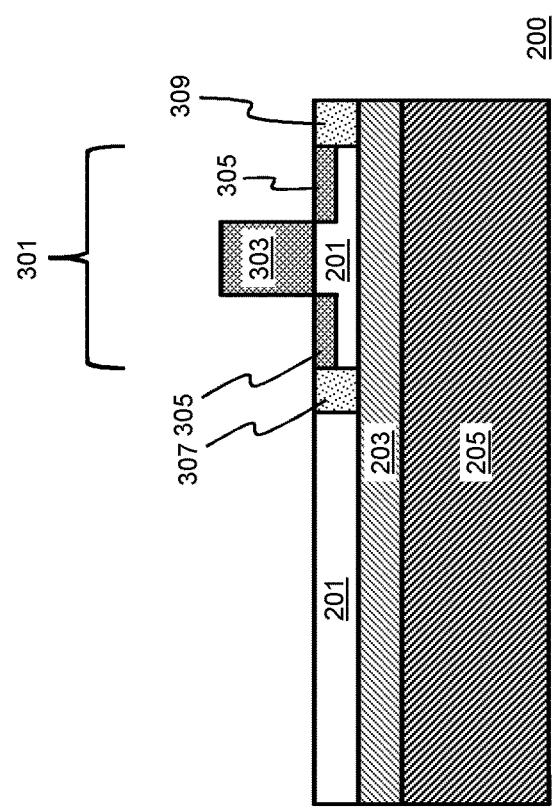

Referring to FIG. 3, a CMOS device 301, e.g., a field-effect transistor (FET), is formed over a portion of the top Si layer 201. The CMOS device 301 may be a FET, a CMOS switch/LNA, a bipolar junction transistor (BJT), a heterojunction bipolar transistor (HBT), a RFCMOS, etc. In this instance, the FET 301 is depicted with a gate 303 and source/drain (S/D) regions 305. Then, trenches (not shown for illustrative convenience) are formed on opposite sides of the CMOS device 301 down to the BOX layer 203, and shallow trench isolation (STI) structures 307 and 309 are formed in the trenches.

Figure 4:
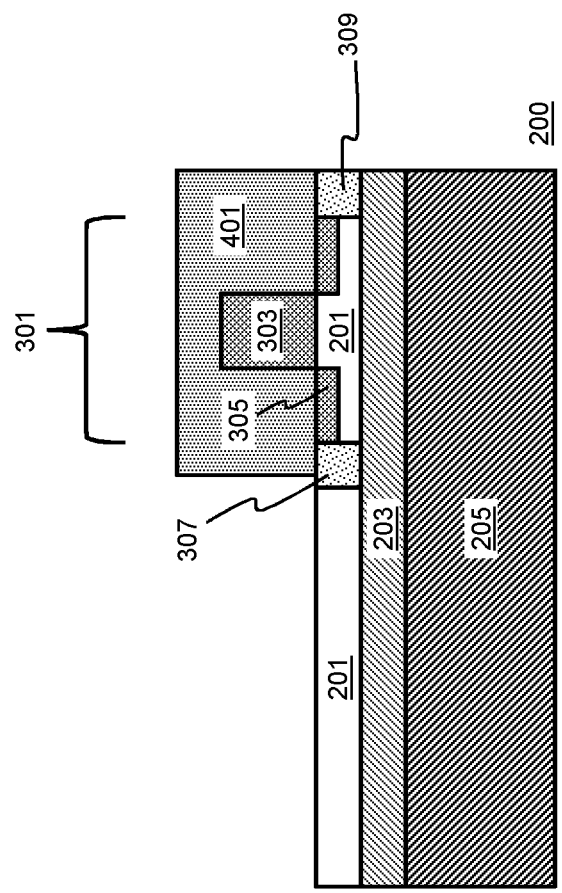

Thereafter, an optional protect layer 401 is formed over the FET 301 to protect it from subsequent GaN stack processing, as depicted in FIG. 4. The protect layer 401 may be formed from one or more layers, such as SiN or SiO$_2$; or it could be formed from a material such as Si or spin on glass, which could be removed in a sacrificial fashion later in the process. In this instance, the protect layer 401 is shown planarized over the FET 301, but is could also be formed without planarization. Further, the protect layer 401 is shown partially covering the STI structure 307, but it could also extend beyond the STI structure 307 into the region that will be subsequently used to form a GaN stack.

Figure 5:
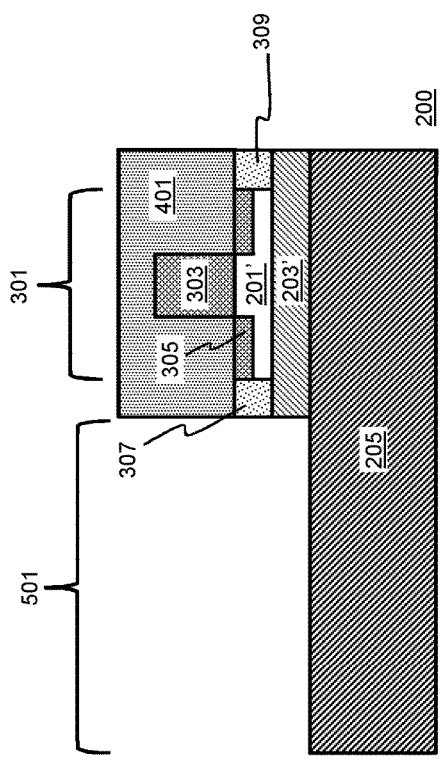

Referring to FIG. 5, a region 501 is opened over the [111] crystal orientation Si handle wafer 205 for the subsequent formation of a GaN stack (not shown for illustrative convenience), forming the top Si layer 201' and the BOX layer 203'. The region 501 may be formed, e.g., by lithographic masking and etching down to the [111] crystal orientation Si handle wafer 205, as known in the art or the region 501 may be formed, e.g., by employing selective etching, as known in the art, so that the etching of the BOX layer 203 could be selective to the [111] crystal orientation Si handle wafer 205 to avoid damage or significant etching of the [111] crystal orientation Si handle wafer 205.

Figure 6:
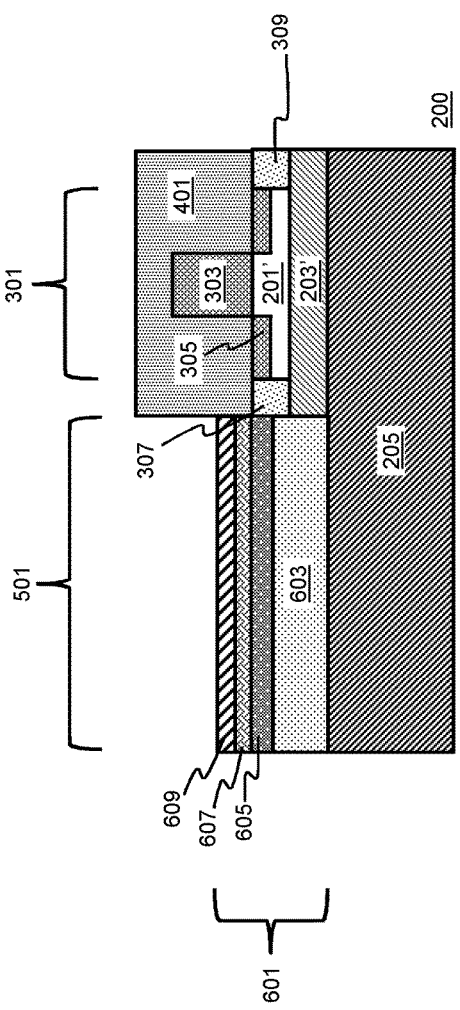

A GaN stack 601 is formed in the region 501, as depicted in FIG. 6. The GaN stack 601 may be formed, e.g., of a buffer layer 603 including a GaN or AlGaN, a GaN channel layer 605, an AlGaN/AlN barrier 607, and a SiN passivation layer 609. In one instance, the layers 603 through 609 have alternating high/low acoustic impedance values, which is needed for forming a Bragg reflector. In one instance, high/low acoustic impedance values can also be achieved by forming alternating layers of GaN and AlGaN in the buffer layer 603 and the Al to Ga ratio in the AlGaN layers can be designed to achieve a good buffer as well as a sufficiently different acoustic impedance values relative to the previously or subsequently formed GaN layers. Also, each layer of the GaN stack 601 is formed as close as possible to an approximate thickness of $n\lambda/4$, wherein n is a positive odd integer, which is compatible with Bragg reflector requirements and known GaN processes. In one instance, the buffer layer 603 may be formed, e.g., to a thickness of 1.5 micrometer (μm) ($3\lambda/4$); the GaN channel layer 605 may be formed. e.g., to a thickness of 0.35 μm to 1.05 um ($\lambda/4$); the AlGaN/AlN barrier 607 may be formed, e.g., to a thickness of 4 nanometer (nm) to 30 nm; and the SiN passivation layer 609 may be, e.g., to a thickness of 480 nm ($\lambda/4$). Further, in one instance, the Al to Ga ratio of the AlGaN/AlN barrier 607 can be adjusted as per the design specifications of the subsequently formed GaN HEMPT PA (not shown for illustrative convenience). In addition, it should be understood that while FIGS. 2 through 6 depict the CMOS device 301 being formed before the formation of the GaN stack 601, the formation order of the CMOS device 301 and the GaN stack 601 may be reversed under certain circumstances. It should also be understood that the GaN stack 601 might not be formed perfectly aligned to the STI structure 307, as depicted in FIG. 6. Alternatively, the formed GaN stack 601 may overlap the edge of the STI layer 307 or there may be a gap between the GaN stack 601 and the STI structure 307.

Figure 7:
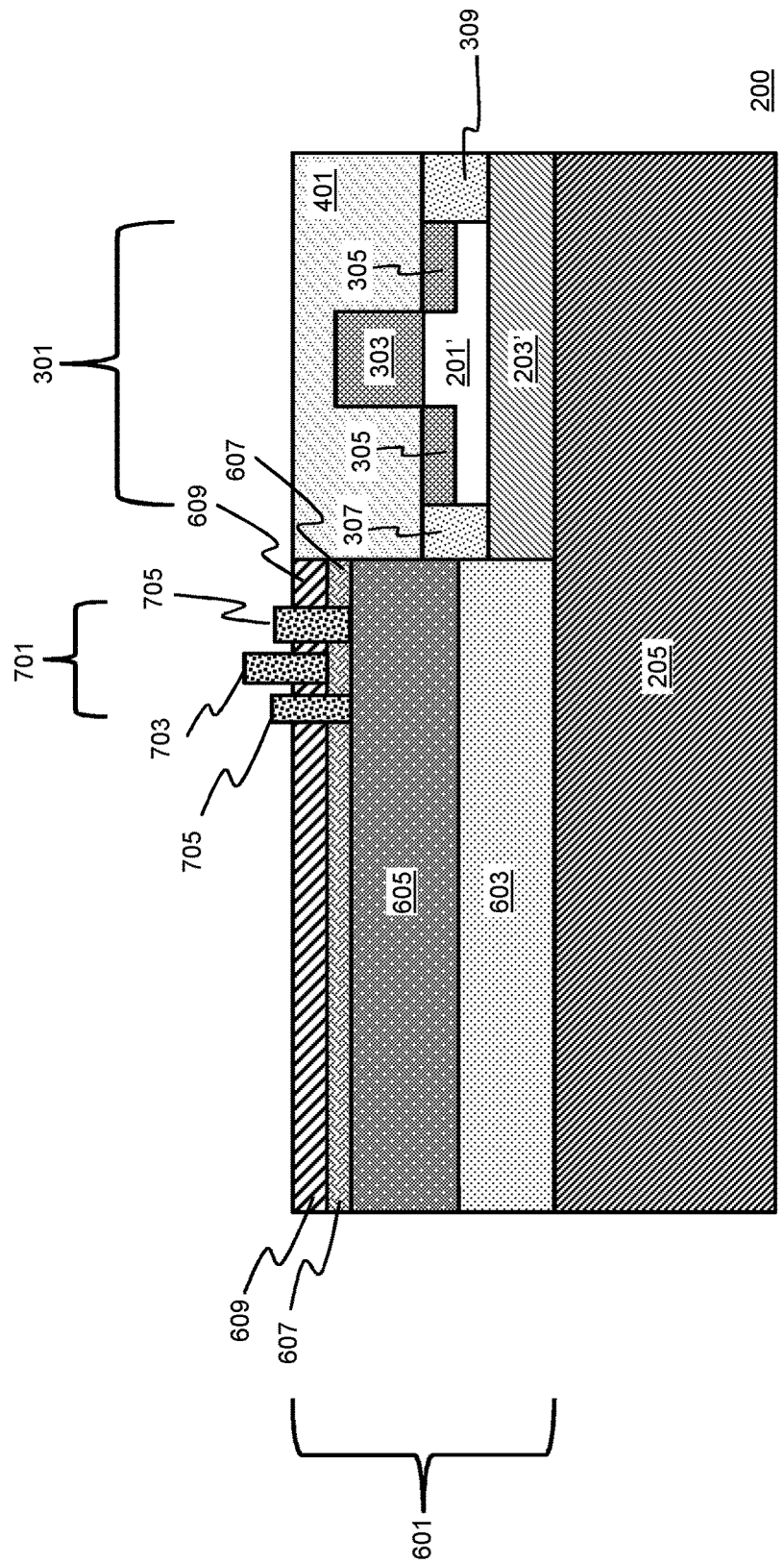

Referring to FIG. 7, a GaN HEMT PA 701 including a gate electrode 703 and S/D electrodes 705 is formed on the GaN channel layer 605 and the AlGaN/AlN barrier 607 of the GaN stack 601, respectively. The gate electrode 703 may be formed by patterning and etching the SiN layer 609 down to the AlGaN/AlN barrier layer 607 and the S/D electrodes 705 may be formed by patterning and etching the SiN layer 609 and the AlGaN/AlN barrier 607 down to the GaN channel layer 605. In this instance, the protect layer 401 is shown coplanar to the GaN HEMT PA 701 for illustrative purposes only and could be thinner or thicker.

Figure 8:
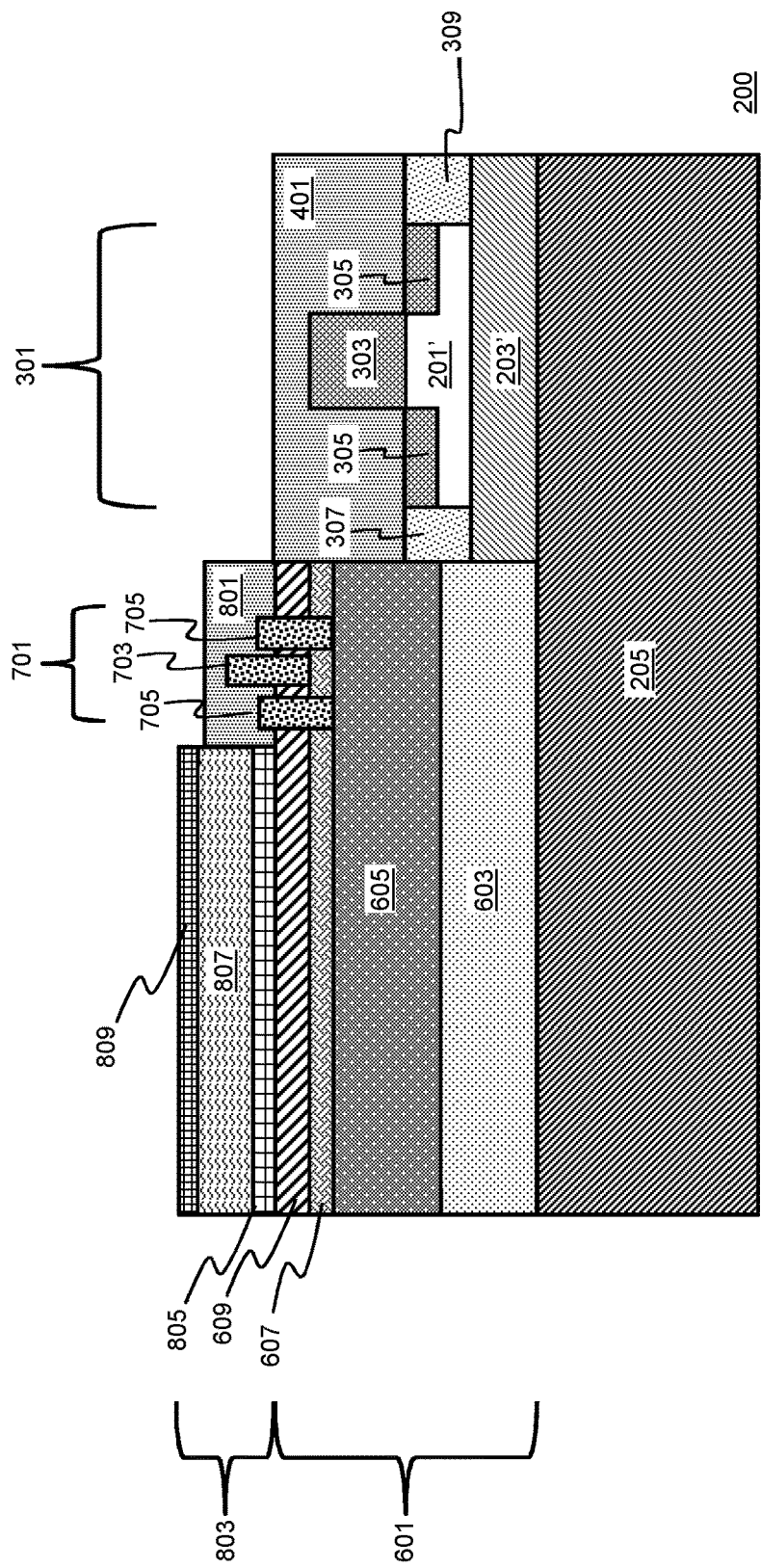

Referring to FIG. 8, an optional protect layer 801 is formed e.g., of one or more layers similar to the protect layer 401, over the GaN HEMT 701. A thin-film acoustic filter 803 is then formed over a portion of the GaN stack 601. In this instance, the thin-film acoustic filter 803 includes a Mo or W layer 805 (bottom electrode); a thin-film piezoelectric layer 807, e.g., formed of aluminum nitride (AlN), scandium aluminum nitride (ScAlN), zinc oxide (ZnO), lithium niobate (LiNbO$_3$), lithium tantalite (LiTaO$_3$), lead zirconate titanate (PZT), or polyvinylidene fluoride (PVDF), or any other piezoelectric material with similar functional properties; and a Mo or W layer 809 (top electrode) and may be formed, e.g., by depositing the films, lithographically patterning them, etching them, and removing the resist (not shown for illustrative convenience), as known in the art. In this instance, the thin-film acoustic filter 803 is a BAW filter, e.g., an AlN BAW filter.

Figure 9:
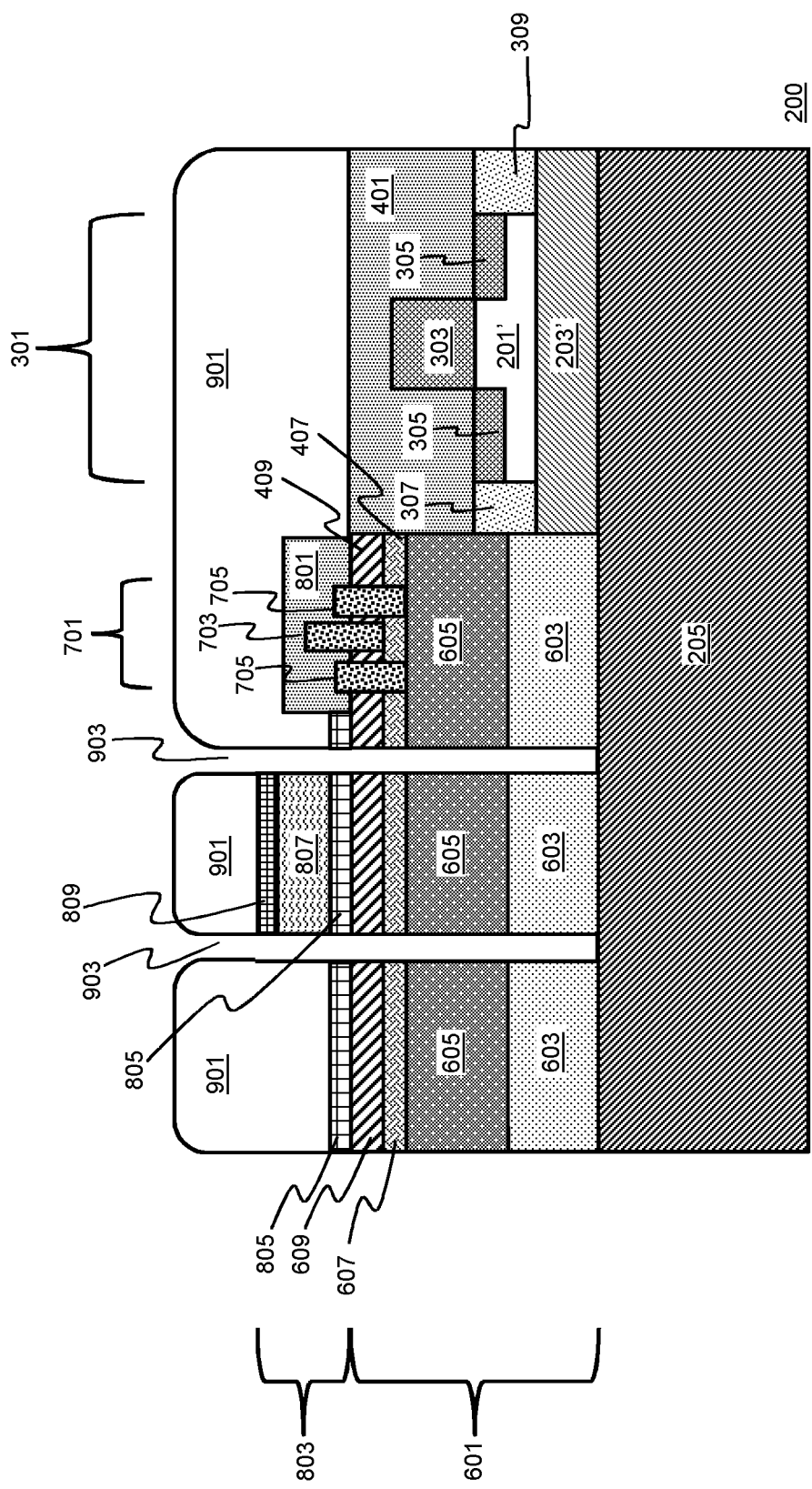

Thereafter, a protective layer 901 is formed over the [111] crystal orientation Si handle wafer 205, patterned, and vias 903 are formed through the protective layer 901, the Mo or W layer 803, and the GaN stack 601 down to the [111] crystal orientation Si handle wafer 205 on opposite sides of the thin-film acoustic filter 803, as depicted in FIG. 9.

Figure 10:
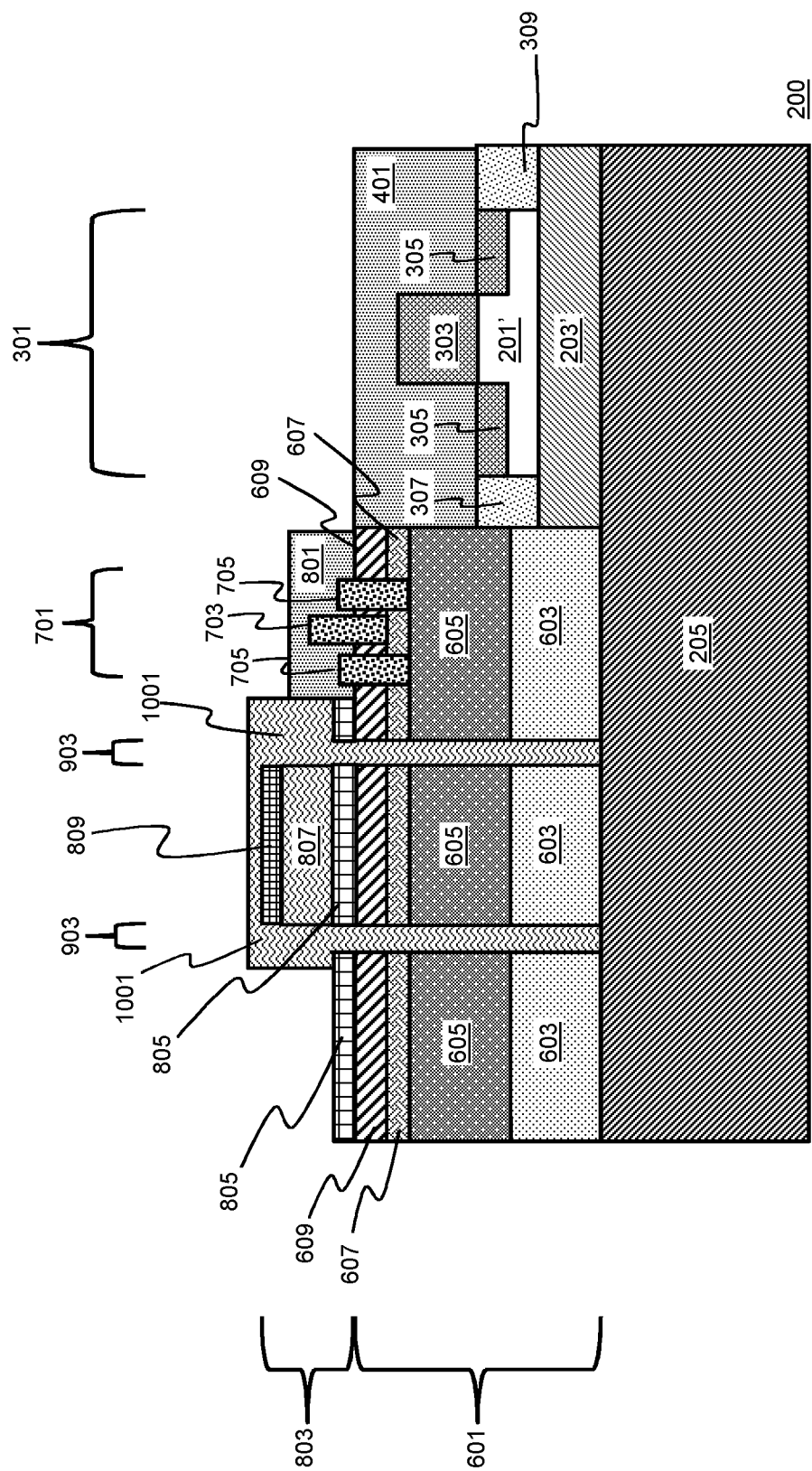

Referring to FIG. 10, the protective layer 901 is removed and a Si sacrificial (SAC) layer 1001 is formed, e.g., by chemical vapor deposition (CVD), plasma enhanced chemical vapor deposition (PECVD), atomic layer deposition (ALD), etc., as known in the art, over the thin-film acoustic filter 803, completely filling the vias 903. The SAC layer 1001 could be preceded by a thin-film deposition and planarization (not shown illustrative convenience) and could include a thin-film protect layer (not shown for illustrative convenience) over and around any of the patterned layers or devices shown.

Figure 11:
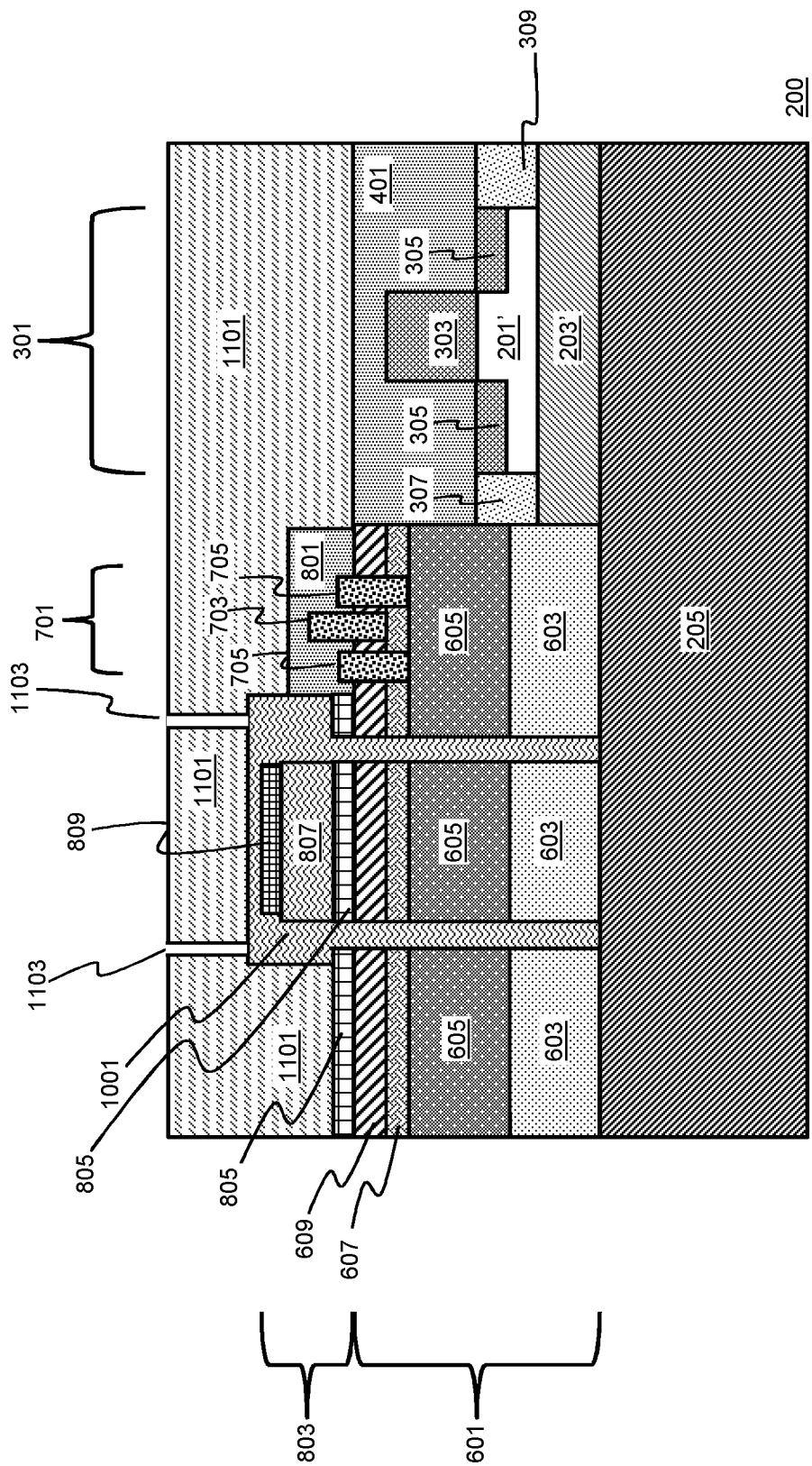
Figure 12:
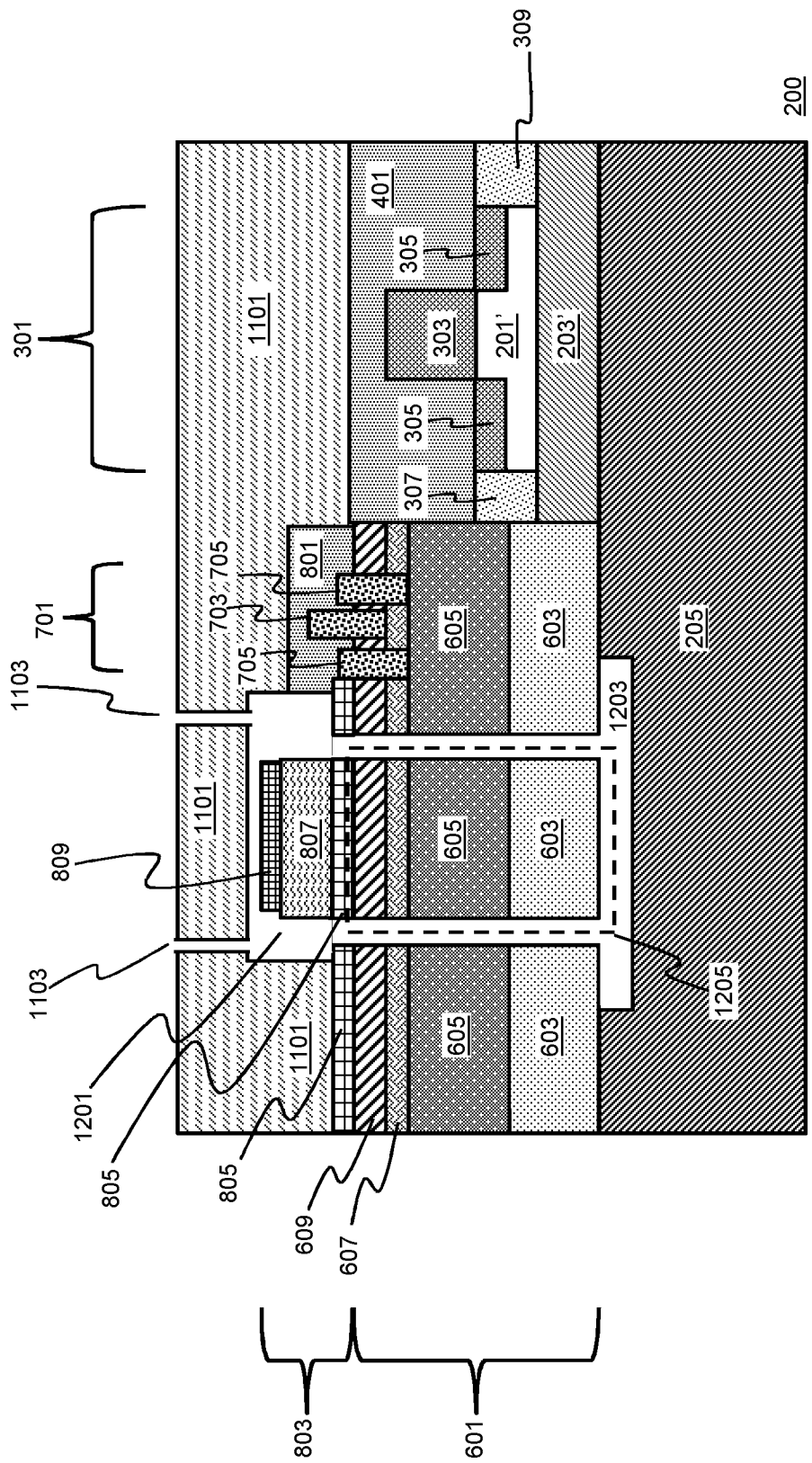

As illustrated in FIG. 11, a thin-film encapsulation layer 1101 is formed, e.g., of oxide/nitride by deposition and optional planarization, over the [111] crystal orientation Si handle wafer 205 and vias 1103 are formed, e.g., by patterning and etching, on opposite sides of the thin-film acoustic filter 803 down to the Si SAC layer 1001. Referring to FIG. 12, the Si SAC layer 1001 is removed through the vias 1103, forming a cavity 1201 over and around the thin-film acoustic filter 803 and a cavity 1203 is formed under the thin-film acoustic filter 803 in the [111] crystal orientation Si handle wafer 205 through the vias 1103. Thereafter, a singulated chip (not shown for illustrative convenience) is formed, e.g., by dicing, through the SOI wafer 200 around the portion of the [111] crystal orientation Si handle wafer 205 including the CMOS device 301, the GaN stack 601, and the thin-film acoustic filter 803. Consequently, the resultant device of FIG. 12 includes a GaN HEMT PA 701, a CMOS device 301, an integrated thin-film piezoelectric acoustic filter 803, e.g., a AlN BAW filter, and an acoustic reflector including both a SiN/GaN-channel/buffer Bragg reflector (as highlighted by the box 1205) and the cavity 1203.

Figure 13:
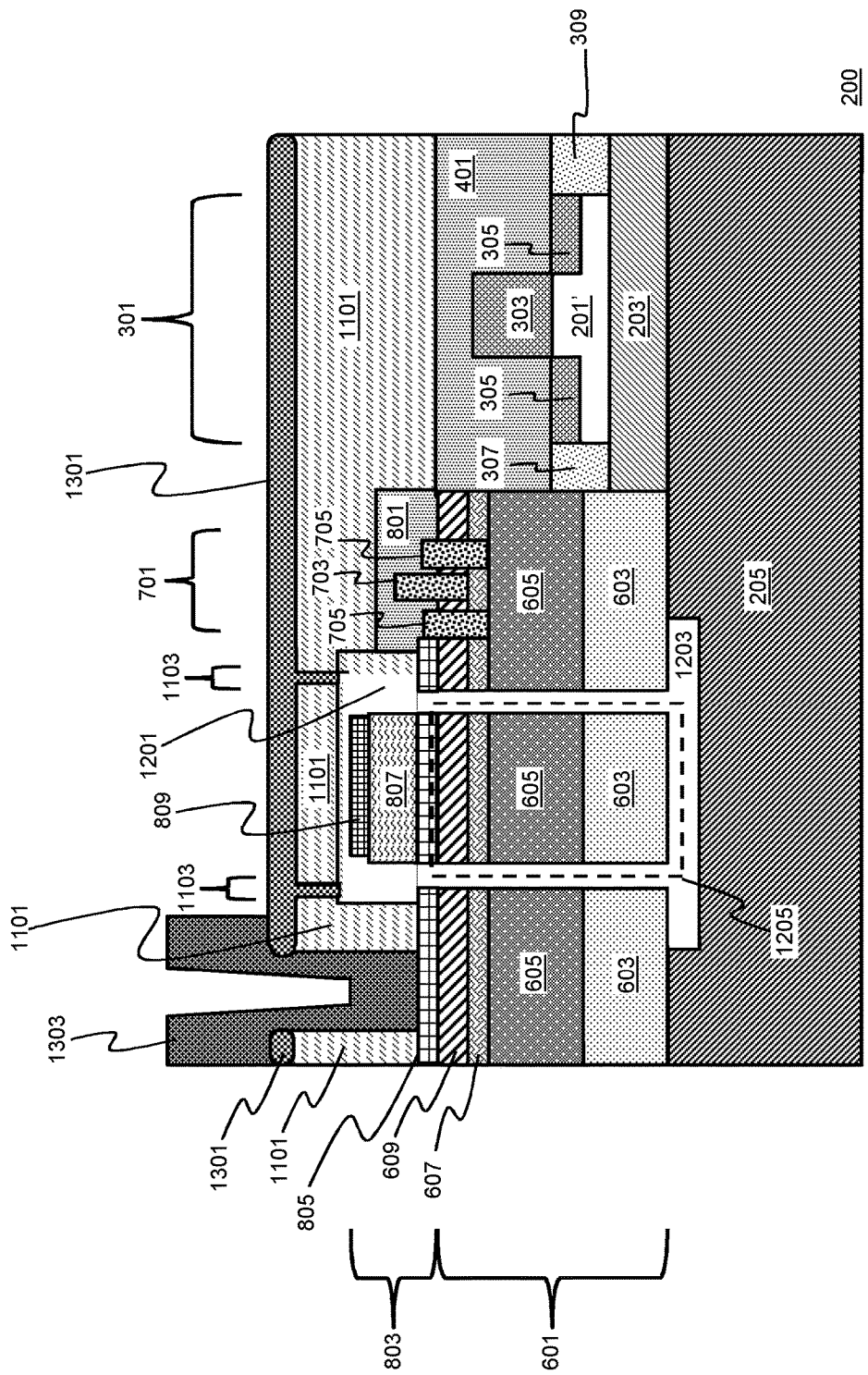

Optionally, a sealing layer 1301 may be formed, e.g., of SiO$_2$ and SiN, over the encapsulation layer 1101, filling the vias 1103, as depicted in FIG. 13. A pad (not shown for illustrative convenience) may also be opened through the sealing layer 1301 and the encapsulation layer 1101 and an Al contact 1303 and liner (not shown for illustrative convenience) may be formed through the sealing layer 1301 and the encapsulation layer 1101 down to the Mo or W layer 803 (bottom electrode) of the thin-film acoustic filter 803. It should be understood with respect to FIGS. 12, 13, and 15 through 20 that the required contacts for the HEMT PA 701 and the CMOS device 301 are not shown for illustrative convenience.

Figure 14:
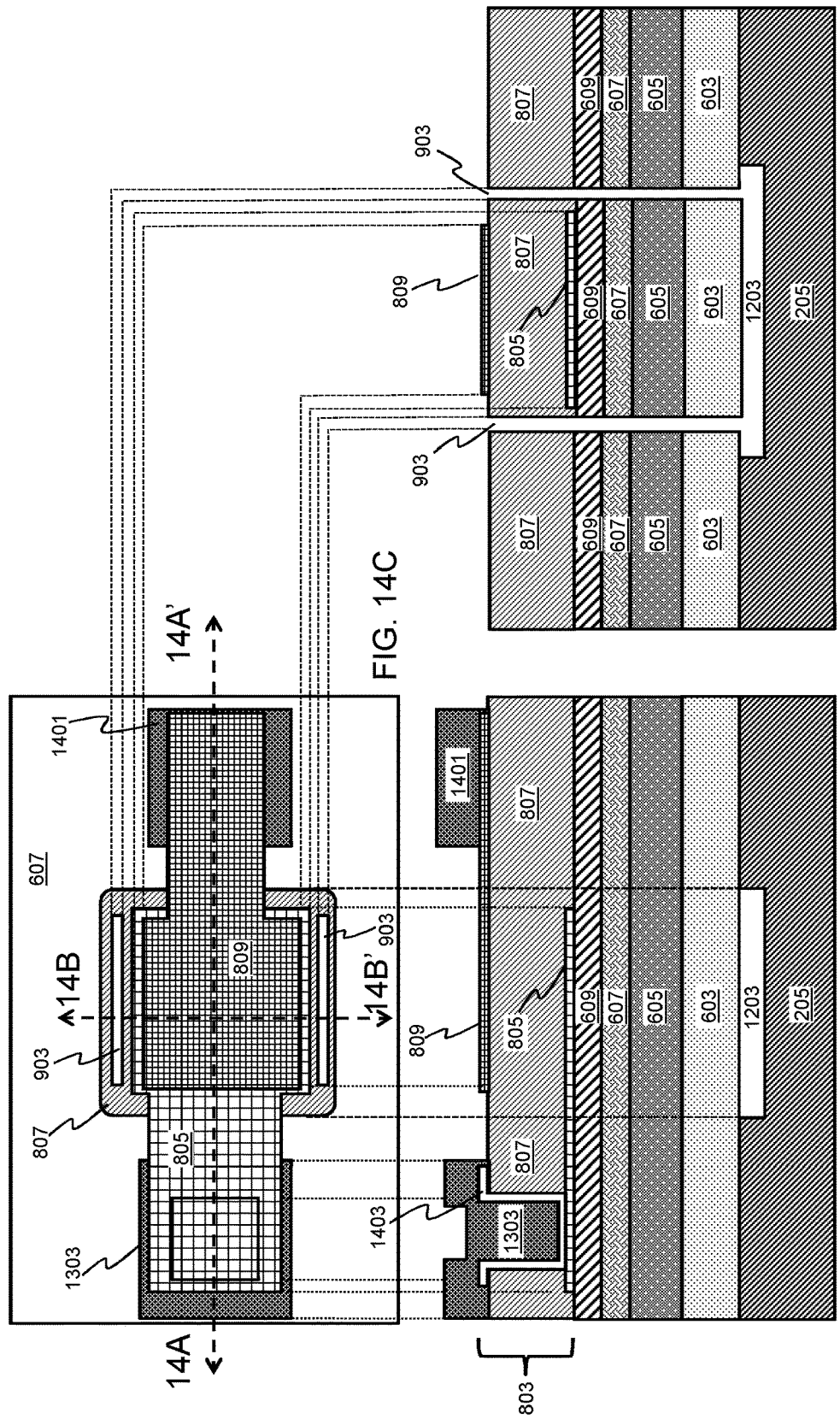
FIGS. 14A and 14B schematically illustrate simplified cross-sectional views of the thin-film piezoelectric BAW filter of FIG. 12, in accordance with an exemplary embodiment.
FIG. 14C schematically illustrates a top view showing the cut lines for FIGS. 14A and 14B.

FIGS. 14A and 14B schematically illustrate simplified cross-sectional views of the thin-film piezoelectric BAW acoustic filter 803 of FIG. 12, and FIG. 14C schematically illustrates a top view showing the cut lines for FIGS. 14A and 14B, in accordance with an exemplary embodiment. Specifically, FIG. 14B represents the same cut plane as FIG. 12. Referring to FIGS. 14A, 14B, and 14C, a contact 1401 is formed, e.g., of Al, on the Mo or W layer 809 (top electrode) of the thin-film acoustic filter 803 and a liner 1403 is formed through the thin-film piezoelectric layer 807 down to the M or W layer 805 (bottom electrode) prior to formation of the Al contact 1303. It should be understood that FIGS. 14A-14C, 21A-21C, 22A-22C, and 23A-23C are provided as illustrations of how the contacts to the thin-film acoustic filter 803 may be formed and are not intended as a limitation.

Figure 15:
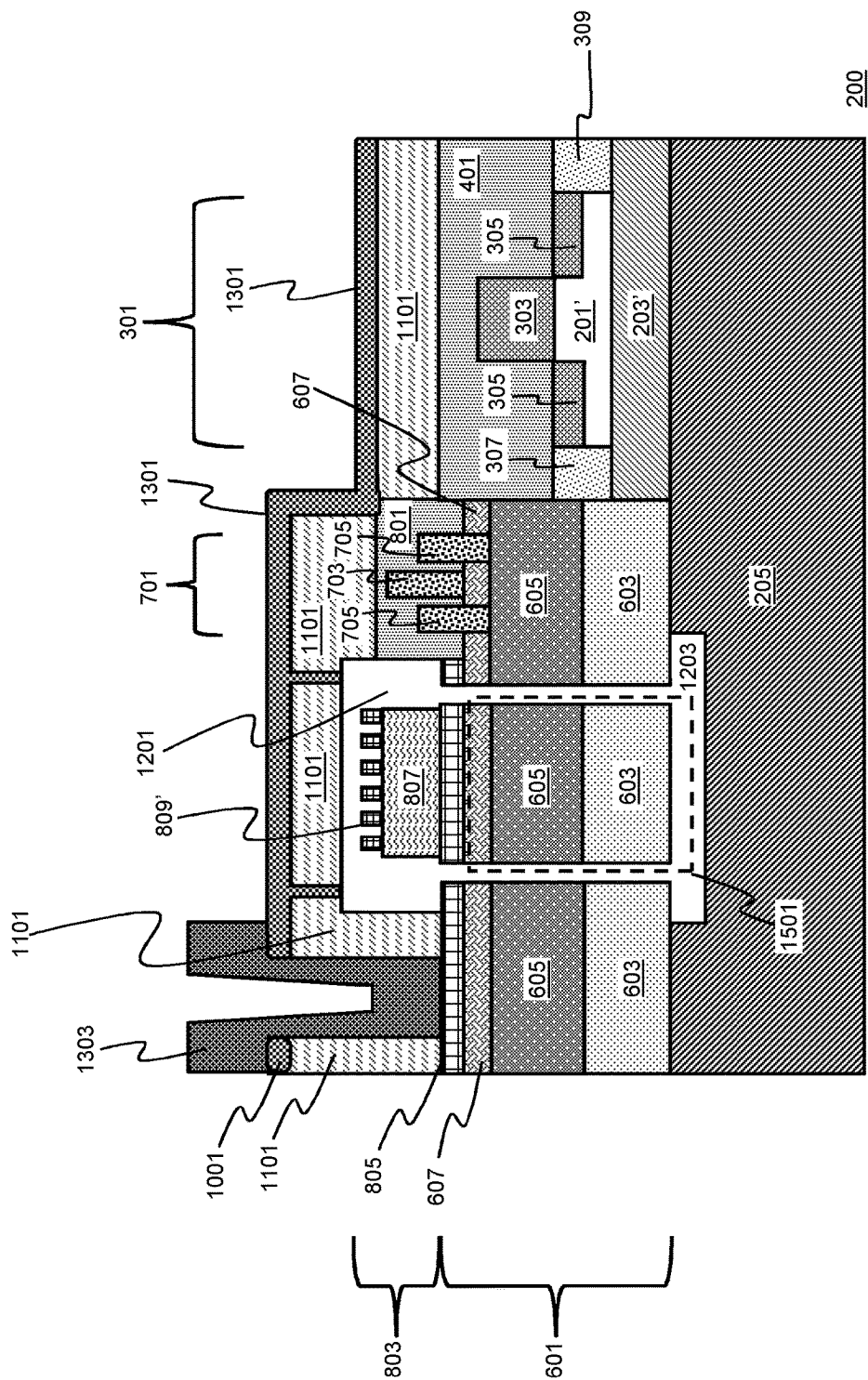
FIG. 15 schematically illustrates a cross-sectional view of a thin-film piezoelectric Lamb acoustic wave filter, a GaN-channel/buffer Bragg reflector, an aluminum gallium nitride/aluminum nitride (AlGaN/AlN) barrier seed layer, and a monolithically integrated GaN HEMT PA and CMOS over a portion of a [111] crystal orientation Si handle wafer of a SOI wafer, in accordance with an exemplary embodiment.

FIG. 15 schematically illustrates a cross-sectional view of a resultant thin-film piezoelectric Lamb acoustic wave filter, a GaN-channel/buffer Bragg reflector, an AlGaN/AlN barrier seed layer, and a monolithically integrated GaN HEMT PA and CMOS over a portion of a [111] crystal orientation Si handle wafer of a SOI wafer, in accordance with an exemplary embodiment. Referring to FIG. 15, the process steps described with respect to FIGS. 2 through 13 are largely the same with respect to the resultant device of FIG. 15; however, the resultant device of FIG. 15 is formed without the passivation layer 609 and the Mo or W layer 809 (top electrode) of the thin-film acoustic filter 803 is etched down to the thin-film piezoelectric layer 807 in an IDT pattern, forming the Mo or W layer 809'. In this instance, the AlGaN/AlN barrier 607 serves as a seed layer for the Mo or W layer 805 (bottom electrode); the thin-film acoustic filter 803 is a Lamb acoustic wave filter, e.g., an AlN Lamb acoustic wave filter, whose frequency is controlled by the pitch of the Mo or W layer IDT pattern (see FIG. 21C) and its thickness, and the thickness of the thin-film piezoelectric layer 807, among other parameters; and the GaN channel Bragg reflector (as highlighted by the box 1501) is formed without the SiN passivation layer 609 of FIG. 13. It should be understood that the CMOS device 301 portion of the SOI wafer 200 is shown non-planarized for illustrative purposes only to show a cross-section without planarization.

Figure 16:
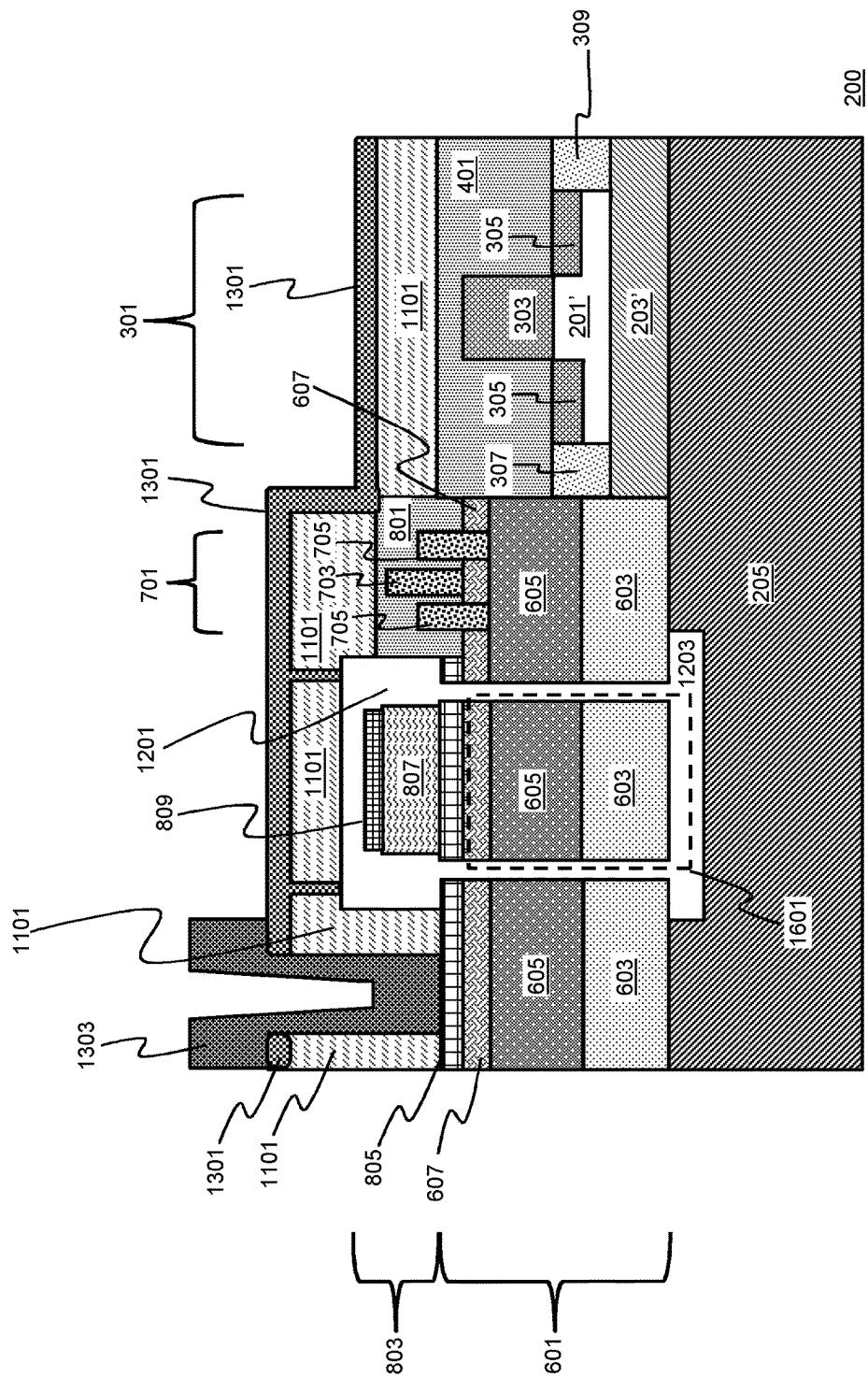
FIG. 16 schematically illustrates a cross-sectional view of a thin-film piezoelectric BAW filter, a GaN-channel/buffer Bragg reflector, an AlGaN/AlN barrier seed layer, and a monolithically integrated GaN HEMT PA and CMOS over a portion of a [111] crystal orientation Si handle wafer of a SOI wafer, in accordance with an another exemplary embodiment.

FIG. 16 schematically illustrates a cross-sectional view of a thin-film piezoelectric BAW filter, a GaN-channel/buffer Bragg reflector, an AlGaN/AlN barrier seed layer, and a monolithically integrated GaN HEMT PA and CMOS over a portion of a [111] crystal orientation Si handle wafer of a SOI wafer, in accordance with an another exemplary embodiment. Referring to FIG. 16, the resultant device of FIG. 16 is nearly identical to the resultant device of FIG. 13; except, in this instance (and similar to FIG. 15), the resultant device is formed without a passivation layer. Consequently, the AlGaN/AlN barrier 607 serves as a seed layer for the Mo or W layer 803 (bottom electrode) of the thin-film acoustic filter 803 and the GaN channel Bragg reflector (as highlighted by the box 1601) is formed without the SiN passivation layer 609 of FIG. 13.

Figure 17:
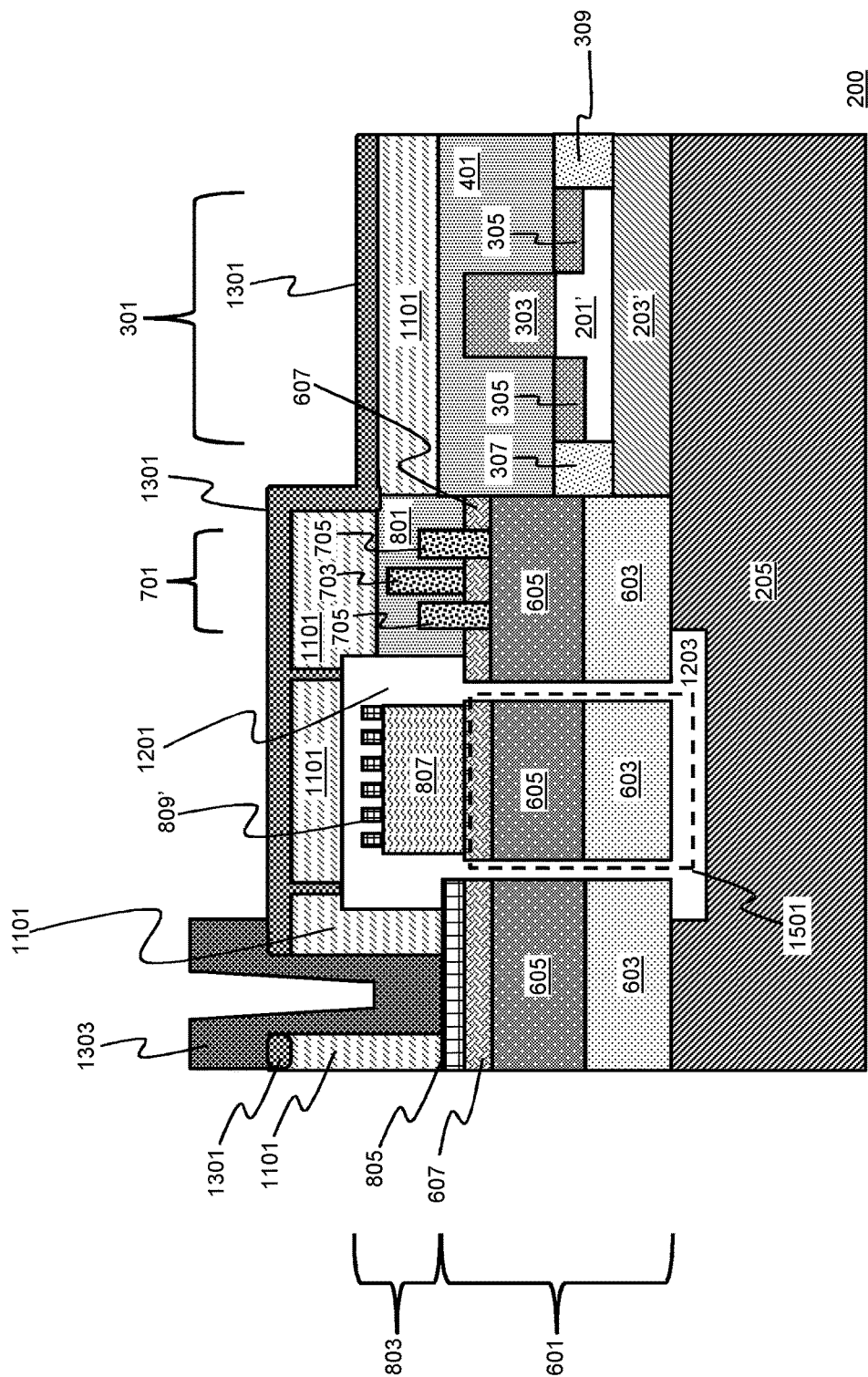
FIG. 17 schematically illustrates a cross-sectional view of a thin-film piezoelectric Lamb acoustic wave filter, GaN-channel/buffer Bragg reflector, and a monolithically integrated GaN HEMT PA and CMOS over a portion of a [111] crystal orientation Si handle wafer of a SOI wafer, in accordance with another exemplary embodiment.

FIG. 17 schematically illustrates a cross-sectional view of a thin-film piezoelectric Lamb acoustic wave filter, GaN-channel/buffer Bragg reflector, and a monolithically integrated GaN HEMT PA and CMOS over a portion of a [111] crystal orientation Si handle wafer of a SOI wafer, in accordance with another exemplary embodiment. Referring to FIG. 17, the resultant device of FIG. 17 is nearly identical to the resultant device of FIG. 15; however, in this instance, the thin-film acoustic filter 803 is formed without the bottom Mo or W layer 803 (bottom electrode).

Figure 18:
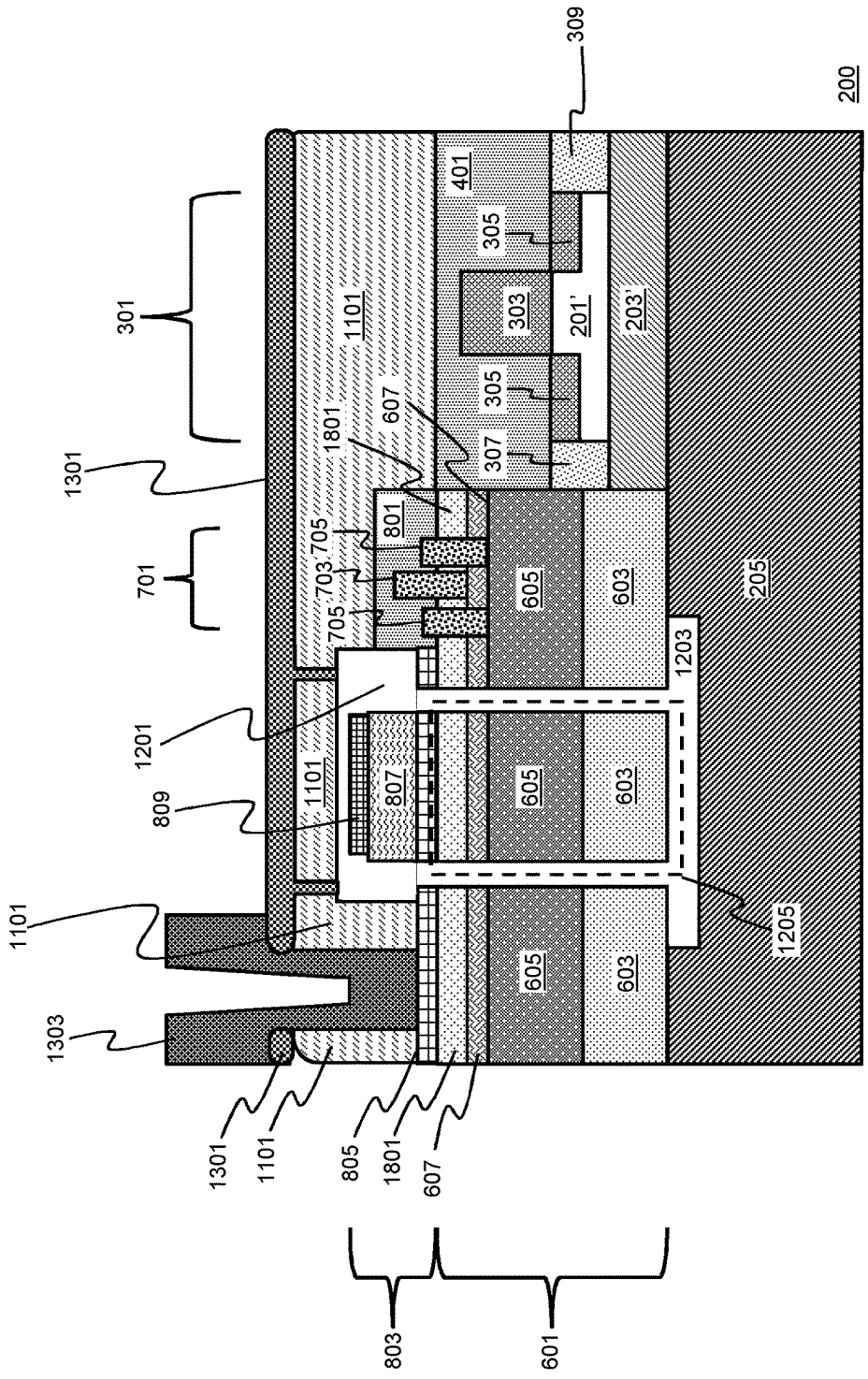
FIG. 18 schematically illustrates a cross-sectional view of a thin-film piezoelectric BAW filter, a silicon oxide (SiO$_2$)/GaN-channel/buffer Bragg reflector, and a monolithically integrated GaN HEMT PA and CMOS over a portion of a [111] crystal orientation Si handle wafer of a SOI wafer, in accordance with an a further exemplary embodiment.

FIG. 18 schematically illustrates a cross-sectional view of a thin-film piezoelectric BAW filter, a SiO$_2$/GaN-channel/buffer Bragg reflector, and a monolithically integrated GaN HEMT PA and CMOS over a portion of a [111] crystal orientation Si handle wafer of a SOI wafer, in accordance with an a further exemplary embodiment. Referring to FIG. 18, the resultant device of FIG. 18 is nearly identical to the resultant device of FIG. 13; however, in this instance, a SiO$_2$ passivation layer 1801 is formed instead of the SiN passivation layer 609.

Figure 19:
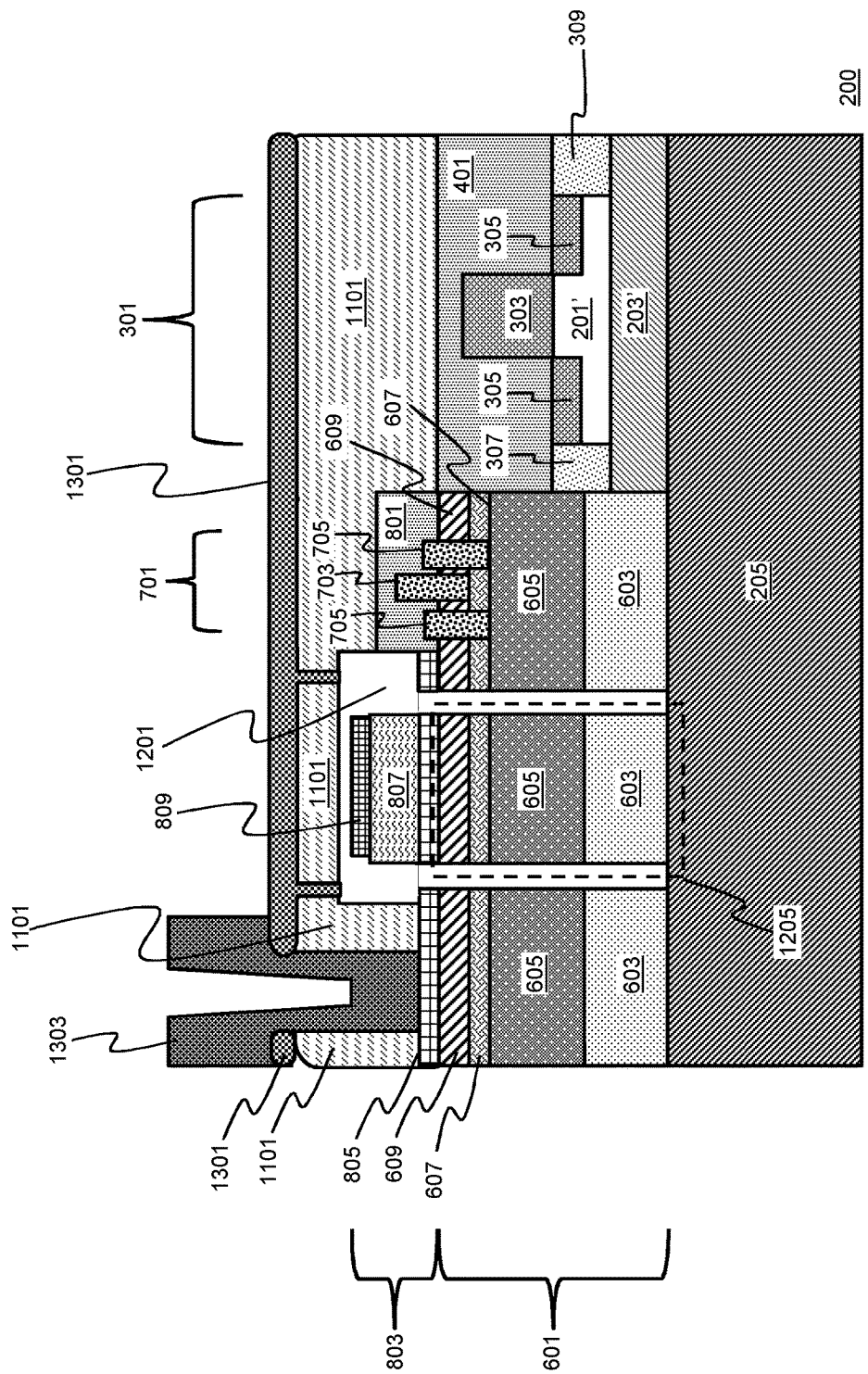
FIG. 19 schematically illustrates a cross-sectional view of a thin-film piezoelectric BAW filter, a SiN/GaN-channel/buffer Bragg reflector, and a monolithically integrated GaN HEMT PA and CMOS over a portion of a [111] crystal orientation Si handle wafer of a SOI wafer, in accordance with an another exemplary embodiment.

FIG. 19 schematically illustrates a cross-sectional view of a thin-film piezoelectric BAW filter, a SiN/GaN-channel/buffer Bragg reflector, and a monolithically integrated GaN HEMT PA and CMOS over a portion of a [111] crystal orientation Si handle wafer of a SOI wafer, in accordance with an another exemplary embodiment. Referring to FIG. 19, the resultant device of FIG. 19 is also nearly identical to the resultant device of FIG. 13; however, in this instance, there is no cavity under the thin-film acoustic filter 803 in the [111] crystal orientation Si handle wafer 205 and, therefore, the acoustic reflector of the device is made up of only the SiN/GaN-channel/buffer Bragg reflector (as highlighted by the box 1205).

Figure 20:
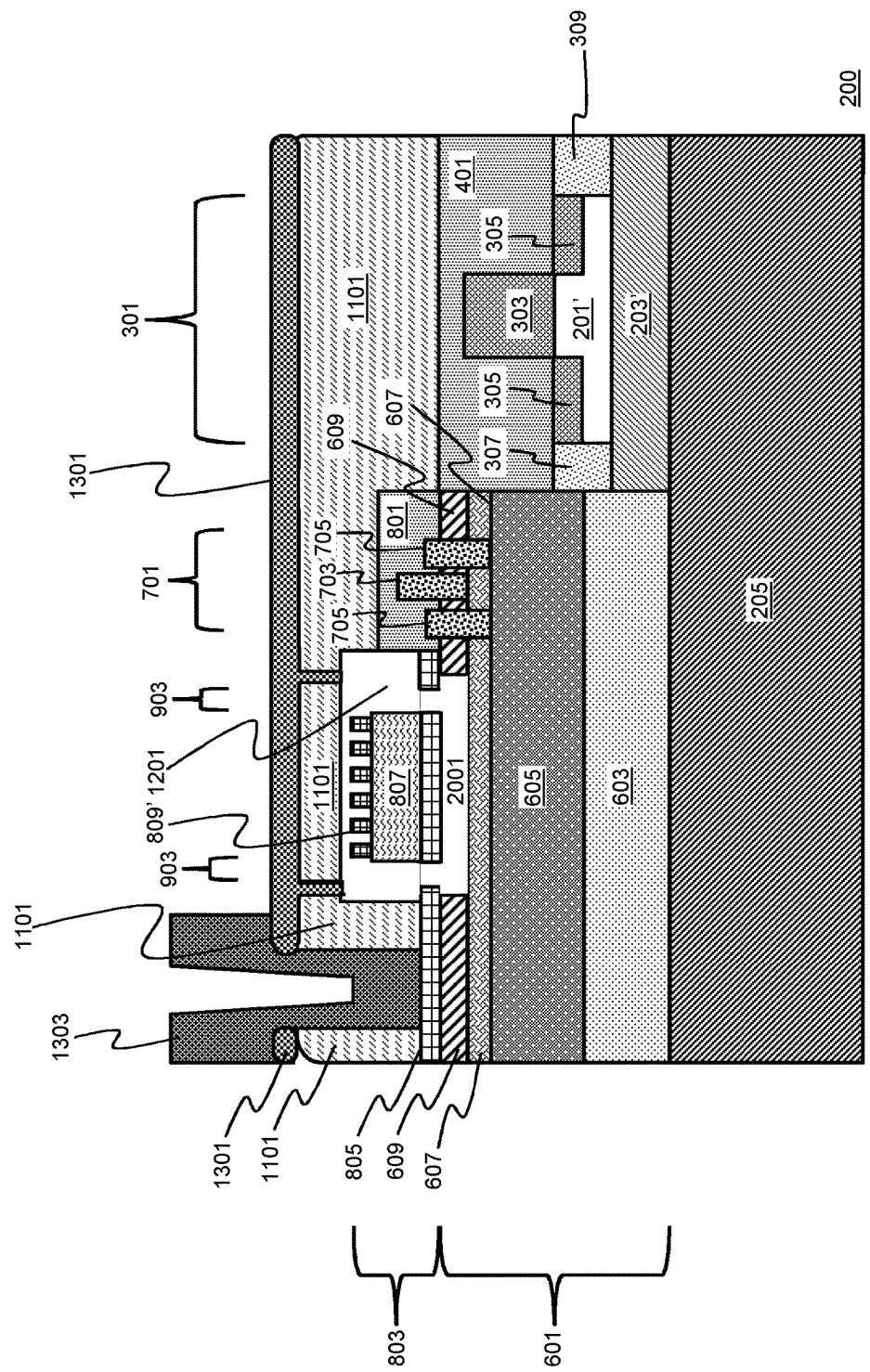
FIG. 20 schematically illustrates a cross-sectional view of a thin-film piezoelectric Lamb acoustic wave filter, a SiN/SiO$_2$ barrier seed layer, and a monolithically integrated GaN HEMT PA and CMOS over a portion of a [111] crystal orientation Si handle wafer of a SOI wafer, in accordance with an exemplary embodiment.

FIG. 20 schematically illustrates a cross-sectional view of a thin-film piezoelectric Lamb acoustic wave filter, a SiN/SiO$_2$ barrier seed layer, and a monolithically integrated GaN HEMT PA and CMOS over a portion of a [111] crystal orientation Si handle wafer of a SOI wafer, in accordance with an exemplary embodiment. Referring to FIG. 20, the resultant device of FIG. 20 is similar to the resultant device of FIG. 13; however, in this instance, the vias 903 are only formed down to the AlGaN/AlN barrier 607 and a cavity 2001 is formed under the thin-film acoustic filter 803 in a portion of the SiN passivation layer 609 rather than in a portion of the [111] crystal orientation Si handle wafer 205. In addition, similar to the resultant device of FIG. 15, the Mo or W layer 809 (top electrode) is etched down to the thin-film piezoelectric layer 807 in an IDT pattern, forming the Mo or W layer 809'. Consequently, the thin-film acoustic filter 803 is a Lamb acoustic wave filter, e.g., an AlN Lamb acoustic wave filter, and the acoustic reflector of the device is made up of only the cavity 2001. Specifically, unlike in FIG. 13 or 15, the GaN stack 601 does not act as Bragg reflector due to the presence of the Mo or W layer 805 (bottom electrode) on the sides of the thin-film piezoelectric layer 807.

FIGS. 21A and 21B schematically illustrate simplified cross-sectional views of the thin-film piezoelectric Lamb acoustic wave filter on a GaN stack with a bottom electrode having contact to a reference voltage and FIG. 21C schematically illustrates a top view showing the cut lines for FIGS. 21A and 21B, in accordance with an exemplary embodiment. Referring to FIGS. 21A, 21B, and 21C, the resultant device of FIGS. 21A, 21B, and 21C is similar to the resultant device of FIG. 15; however, in this instance, the resultant device includes the SiN passivation layer 609. Moreover, the bottom Mo or W layer 805 (bottom electrode) of the thin-film acoustic filter 803 is connected to a reference voltage, e.g., ground (GND) (not shown for illustrate convenience), through the liner 2101 and the Al contact 1303. The resultant device also includes two contacts 2103 that are formed, e.g., of Al, laterally separated, on the top Mo or W layer 809' (top electrode) of the thin-film acoustic filter 803.

FIGS. 22A and 22B schematically illustrate simplified cross-sectional views of a thin-film piezoelectric Lamb acoustic wave filter on a GaN stack with a floating bottom electrode and FIG. 22C schematically illustrates a top view showing the cut lines for FIGS. 22A and 22B, in accordance with an exemplary embodiment. The resultant device of FIGS. 22A, 22B, and 22C is similar to the resultant device of FIGS. 21A, 22B, and 22C; however, in this instance the bottom Mo or W layer 805 (bottom electrode) of the thin-film acoustic filter 803 is floating.

FIGS. 23A and 23B schematically illustrate simplified cross-sectional views of the thin-film piezoelectric Lamb acoustic wave filter on a GaN stack without a bottom electrode and FIG. 23C schematically illustrates a top view showing the cut lines for FIGS. 23A and 23B, in accordance with an exemplary embodiment. The resultant device of FIGS. 23A, 23B, and 23C is similar to the resultant device of FIGS. 22A, 22B, and 22C; however, in this instance the device is formed without the bottom M or W layer 805 (bottom electrode) of the thin-film acoustic filter 803.

The embodiments of the present disclosure can achieve several technical effects such as integration of a GaN PA over a singulated portion of a [111] crystal orientation Si handle wafer of a SOI wafer; a thin-film piezoelectric acoustic filter, e.g., an AlN acoustic filter, over GaN PA layers and a CMOS device over a portion of a [100] or [110] crystal orientation top Si layer of the SOI wafer. Additional technical affects include a Bragg reflector made of layers of alternating high/low acoustic impedance such as SiN or SiO$_2$, an AlGaN barrier, a GaN channel, and a buffer (GaN PA stack) using a known GaN process to improve the Q factor of the thin-film acoustic filter; the SiN, AlGaN, GaN and epiGaN/epiAlN buffer layers of the GaN PA stack having an approximate thickness of nλ/4, wherein n is a positive odd integer (n=1, 3, 5, . . . ); a GaN PA stack buffer formed of alternating layers of GaN and AlGaN, wherein the Al to Ga ratio in the AlGaN layers can be designed to achieve a good buffer as well as a sufficiently different acoustic impedance value relative to the GaN layers; an AlGaN/AlN barrier layer, e.g., 5 nm to 25 nm thick, serving as a seed layer for the formation of a piezoelectric layer of a thin-film acoustic filter, e.g., made of AlN with strong (002) orientation, that can provide for a large $k^2_{eff}$>6%; a cavity under the thin-film acoustic filter in the [111] crystal orientation Si handle wafer further improving the Q factor; and a process suitable for ScAlN and larger $k^2_{eff}$>9% thereof. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any devices including a thin-film acoustic filter and a CMOS device.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a silicon on insulator (SOI) wafer comprising a [111] crystal orientation silicon (Si) handle wafer, a buried oxide (BOX) layer, and a top Si layer;
   forming a complimentary metal-oxide semiconductor (CMOS) device over the top Si layer of the SOI wafer;
   forming a Bragg reflector over the [111] crystal orientation Si handle wafer, the Bragg reflector comprising a gallium nitride (GaN) stack with alternating layers of high/low acoustic impedance;
   forming a sacrificial (SAC) layer over and around the thin-film acoustic filter;
   forming an encapsulation layer over the SOI wafer;
   forming a via through the encapsulation layer on opposite sides of the thin-film acoustic filter;
   removing the SAC layer through the via, a cavity formed over and around the thin-film acoustic filter;
   forming a sealing layer over the encapsulation layer; and
   forming a metal contact through the sealing layer and the encapsulation layer down to a portion of the thin-film acoustic filter.

2. The method according to claim 1, comprising forming the GaN stack by:
   forming a buffer layer over the [111] crystal orientation Si handle wafer;
   forming a GaN channel layer over the buffer layer; and
   forming an aluminum gallium nitride (AlGaN)/aluminum nitride (AlN) barrier layer over the GaN channel layer.

3. The method according to claim 2, further comprising forming a thin-film acoustic filter over the GaN stack by:
   forming a first molybdenum (Mo) or tungsten (W) layer over the AlGaN/AlN barrier layer;
   forming an aluminum nitride (AlN), scandium aluminum nitride (ScAlN), zinc oxide (ZnO), lithium niobate (LiNbO$_3$), lithium tantalite (LiTaO$_3$), lead zirconate titanate (PZT), or polyvinylidene fluoride (PVDF) layer over the first Mo or W layer;
   forming a second Mo or W layer over the AlN, ScAlN, ZnO, LiNbO$_3$, LiTaO$_3$, PZT, or PVDF layer;
   forming a via through the first Mo or W layer and the GaN stack on opposite sides of the thin-film acoustic filter; and
   forming a cavity under the thin-film acoustic filter in the [111] crystal orientation Si handle wafer through the vias.

4. The method according to claim 3, further comprising etching the second Mo or W layer in an interdigitated (IDT) pattern down to the AlN, ScAlN, ZnO, LiNbO$_3$, LiTaO$_3$, PZT, or PVDF layer.

5. The method according to claim 2, further comprising forming a thin-film acoustic filter over the GaN stack by:
   forming an AlN, ScAlN, ZnO, LiNbO$_3$, LiTaO$_3$, PZT, or PVDF layer over the AlGaN/AlN barrier layer;
   forming a Mo or W layer over the AlN, ScAlN, ZnO, LiNbO$_3$, LiTaO$_3$, PZT, or PVDF layer;
   patterning the second Mo or W layer down to the AlN, ScAlN, ZnO, LiNbO$_3$, LiTaO$_3$, PZT, or PVDF layer;
   forming a via through the GaN stack on opposite sides of the thin-film acoustic filter; and
   forming a cavity under the thin-film acoustic filter in the [111] crystal orientation Si handle through the vias.

6. The method according to claim 1, comprising forming GaN stack by:
   forming a buffer layer over the [111] crystal orientation Si handle wafer;
   forming a GaN channel layer over the buffer layer;
   forming an AlGaN/AlN barrier layer over the GaN channel layer; and
   forming a silicon nitride (SiN) or silicon dioxide (SiO$_2$) passivation layer over the AlGaN/AlN barrier layer.

7. The method according to claim 6, further comprising forming a thin-film acoustic filter over the GaN stack by:
   forming a first Mo or W layer over the AlGaN/AlN barrier layer;

forming an AlN, ScAlN, ZnO, LiNbO₃, LiTaO₃, PZT, or PVDF layer over the first Mo or W layer;
forming a second Mo or W layer over the AlN, ScAlN, ZnO, LiNbO₃, LiTaO₃, PZT, or PVDF layer;
forming a via through the first Mo or W layer and the GaN stack on opposite sides of the thin-film acoustic filter; and
forming a cavity under the thin-film acoustic filter in the [111] crystal orientation Si handle wafer through the vias.

8. The method according to claim 1, further comprising forming a GaN high-electron-mobility transistor power amplifier (GaN HEMT PA) in and over respective portions of the GaN stack.

9. A device comprising:
a silicon on insulator (SOI) wafer, the SOI wafer comprising a [111] crystal orientation silicon (Si) handle wafer, a buried oxide (BOX) layer, and a top Si layer
a complimentary metal-oxide-semiconductor (CMOS) device over the top Si layer;
a Bragg reflector over the [111] crystal orientation Si handle, the Bragg Reflector comprising a gallium nitride (GaN) stack with alternating layers of high/low acoustic impedance; and
a GaN high-electron-mobility transistor power amplifier (GaN HEMT PA) in and over respective portions of the GaN stack.

10. The device according to claim 9, wherein the GaN stack comprises:
a buffer layer over the [111] crystal orientation Si handle wafer;
a GaN channel layer over the buffer layer; and
an aluminum gallium nitride (AlGaN)/aluminum nitride (AlN) barrier layer over the GaN channel layer.

11. The device according to claim 10, further comprising a thin-film acoustic filter over the GaN stack, wherein the thin-film acoustic filter comprises:
a first molybdenum (Mo) or tungsten (W) layer over the AlGaN/AlN barrier layer;
an aluminum nitride (AlN), scandium aluminum nitride (ScAlN), zinc oxide (ZnO), lithium niobate (LiNbO₃), lithium tantalite (LiTaO₃), lead zirconate titanate (PZT), or polyvinylidene fluoride (PVDF) layer over the first Mo or W layer;
a second Mo or W layer over the AlN, ScAlN, ZnO, LiNbO₃, LiTaO₃, PZT, or PVDF layer;
a via through the first Mo or W layer and the GaN stack on opposite sides of the thin-film acoustic filter; and
a cavity under the thin-film acoustic filter in the [111] crystal orientation Si handle wafer,
wherein the thin-film acoustic filter is a bulk acoustic wave (BAW) filter.

12. The device according to claim 10, further comprising a thin-film acoustic filter over the GaN stack, wherein the thin-film acoustic filter comprises:
a first Mo or W layer over the AlGaN/AlN barrier layer;
an AlN, ScAlN, ZnO, LiNbO₃, LiTaO₃, PZT, or PVDF layer over the first Mo or W layer;
a second Mo or W layer in an interdigitated (IDT) pattern over the AlN, ScAlN, ZnO, LiNbO₃, LiTaO₃, PZT, or PVDF layer;
a via through the first Mo or W layer and the GaN stack on opposite sides of the thin-film acoustic filter; and
a cavity under the thin-film acoustic filter in the [111] crystal orientation Si handle wafer,
wherein the thin-film acoustic filter is a Lamb filter.

13. The device according to claim 12, wherein the thin-film acoustic filter comprises:
an AlN, ScAlN, ZnO, LiNbO₃, LiTaO₃, PZT, or PVDF layer over the AlGaN/AlN barrier layer;
a Mo or W layer in an IDT pattern over the AlN, ScAlN, ZnO, LiNbO₃, LiTaO₃, PZT, or PVDF layer;
a via through the GaN stack on opposite sides of the thin-film acoustic filter; and
a cavity under the thin-film acoustic filter in the [111] crystal orientation Si handle wafer,
wherein the thin-film acoustic filter is a Lamb filter.

14. The device according to claim 9, wherein the GaN stack comprises:
a buffer layer over the [111] crystal orientation Si handle wafer;
a GaN channel layer over the buffer layer;
an AlGaN/AlN barrier layer over the GaN channel layer; and
a silicon nitride (SiN) or silicon dioxide (SiO₂) passivation layer over the AlGaN/AlN barrier layer.

15. The device according to claim 14, further comprising a thin-film acoustic filter over the GaN stack, wherein the thin-film acoustic filter comprises:
a first Mo or W layer over the AlGaN/AlN barrier layer;
an AlN, ScAlN, ZnO, LiNbO₃, LiTaO₃, PZT, or PVDF layer over the first Mo or W layer;
a second Mo or W layer over the AlN, ScAlN, ZnO, LiNbO₃, LiTaO₃, PZT, or PVDF layer;
a via through the first Mo or W layer and the GaN stack on opposite sides of the thin-film acoustic filter; and
a cavity under the thin-film acoustic filter in the [111] crystal orientation Si handle wafer,
wherein the thin-film acoustic filter is a BAW filter.

16. The device according to claim 11, further comprising:
an encapsulation layer over the [111] crystal orientation Si handle wafer with a cavity over and around the thin-film acoustic filter;
a sealing layer over the encapsulation layer; and
a metal contact through the sealing layer and the encapsulation layer down to a portion of the thin-film acoustic filter.

17. A device comprising:
a silicon on insulator (SOI) wafer, the SOI wafer comprising a [111] crystal orientation silicon (Si) handle wafer, a buried oxide (BOX) layer, and a top Si layer;
a complimentary metal-oxide-semiconductor (CMOS) device over the top Si;
a gallium nitride (GaN) stack over the [111] crystal orientation Si handle;
a GaN high-electron-mobility transistor power amplifier (GaN HEMT PA) in and over the GaN stack;
a thin-film Lamb acoustic wave filter over the GaN stack;
a via through the first Mo or W layer on opposite sides of the thin-film Lamb acoustic wave filter; and
a cavity under the thin-film Lamb acoustic filter in a passivation layer of the GaN stack.

18. The device according to claim 17, wherein the GaN stack comprises:
a buffer layer over the [111] crystal orientation Si handle wafer;
a GaN channel layer over the buffer layer;
an AlGaN/AlN barrier layer over the GaN channel layer; and
the passivation layer of silicon nitride (SiN) or silicon dioxide (SiO₂) over the AlGaN/AlN barrier layer.

* * * * *